(12) United States Patent
Xie et al.

(10) Patent No.: US 12,725,564 B2
(45) Date of Patent: Sep. 1, 2026

(54) DISPLAY PANEL AND DISPLAY DEVICE

(71) Applicant: Tianma Advanced Display Technology Institute (Xiamen) Co., Ltd., Xiamen (CN)

(72) Inventors: Mengmeng Xie, Xiamen (CN); Tianyi Wu, Xiamen (CN); Wenxin Jiang, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 0 days.

(21) Appl. No.: 18/926,000

(22) Filed: Oct. 24, 2024

(65) Prior Publication Data

US 2026/0051280 A1 Feb. 19, 2026

(30) Foreign Application Priority Data

Aug. 16, 2024 (CN) ......................... 202411127800.X

(51) Int. Cl.
*G09G 3/32* (2016.01)
*H10D 86/40* (2025.01)
*H10D 86/60* (2025.01)

(52) U.S. Cl.
CPC ............ *G09G 3/32* (2013.01); *H10D 86/441* (2025.01); *H10D 86/60* (2025.01); *G09G 2300/0426* (2013.01); *G09G 2300/0842* (2013.01); *G09G 2300/0861* (2013.01); *G09G 2310/0286* (2013.01); *G09G 2330/04* (2013.01)

(58) Field of Classification Search
CPC ........... G11C 19/28; G09G 2310/0286; G09G 2300/0408; G09G 2300/0426; G09G 3/32; G09G 2330/04; H10D 86/441; H10D 86/60
See application file for complete search history.

(56) References Cited

U.S. PATENT DOCUMENTS

| | | | | |
|---|---|---|---|---|
| 11,580,895 B1 * | 2/2023 | Zou | .......................... | G09G 3/32 |
| 2023/0196991 A1 * | 6/2023 | Zou | ...................... | G09G 3/3266 345/55 |
| 2023/0222969 A1 * | 7/2023 | Peng | ........................ | G09G 3/32 345/55 |
| 2024/0321189 A1 * | 9/2024 | Dai | ......................... | G09G 3/32 |

FOREIGN PATENT DOCUMENTS

| | | |
|---|---|---|
| CN | 112349756 A | 2/2021 |
| CN | 115398527 A | 11/2022 |

* cited by examiner

*Primary Examiner* — Xuemei Zheng
(74) *Attorney, Agent, or Firm* — Anova Law Group, PLLC

(57) ABSTRACT

A display panel and a display device are provided. The display panel includes: a substrate, a driving layer, and an electrode layer. The driving layer and the electrode layer are located on a side of the substrate. The driving layer includes a shift register, and the shift register includes a plurality of cascaded shift register units. The electrode layer includes a plurality of electrode groups, and one of the plurality of electrode groups includes a first electrode and a second electrode. Along a direction perpendicular to a plane where the substrate is located, the plurality of shift register units at least partially overlaps with at least one of the plurality of electrode groups.

19 Claims, 22 Drawing Sheets

DISPLAY PANEL AND DISPLAY DEVICE

CROSS-REFERENCE TO RELATED APPLICATION

This application claims the priority of Chinese Patent Application No. 202411127800.X, filed on Aug. 16, 2024, the content of which is incorporated herein by reference in its entirety.

TECHNICAL FIELD

The present disclosure generally relates to the field of display technology and, more particularly, relates to a display panel and a display device.

BACKGROUND

A light-emitting diode (LED) can efficiently convert electrical energy into light energy, and has the characteristics of small size, long life, high efficiency, energy saving, rich colors, etc. With the continuous advancement of technology, LEDs have been widely used in the fields of photography, flat panel display, medical devices, etc. In the display field, a LED can be used as a sub-pixel of transparent display or large-screen splicing display. How to achieve borderless display and ensure that an edge area has a certain transmittance in the application is one of the key issues currently studied.

SUMMARY

One aspect of the present disclosure provides a display panel. The display panel includes: a substrate, a driving layer, and an electrode layer. The driving layer and the electrode layer are located on a side of the substrate. The driving layer includes a shift register, and the shift register includes a plurality of cascaded shift register units. The electrode layer includes a plurality of electrode groups, and one of the plurality of electrode groups includes a first electrode and a second electrode. Along a direction perpendicular to a plane where the substrate is located, the plurality of shift register units at least partially overlaps with at least one of the plurality of electrode groups.

Another aspect of the present disclosure provides a display device. The display device includes a display panel. The display panel includes: a substrate, a driving layer, and an electrode layer. The driving layer and the electrode layer are located on a side of the substrate. The driving layer includes a shift register, and the shift register includes a plurality of cascaded shift register units. The electrode layer includes a plurality of electrode groups, and one of the plurality of electrode groups includes a first electrode and a second electrode. Along a direction perpendicular to a plane where the substrate is located, the plurality of shift register units at least partially overlaps with at least one of the plurality of electrode groups.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
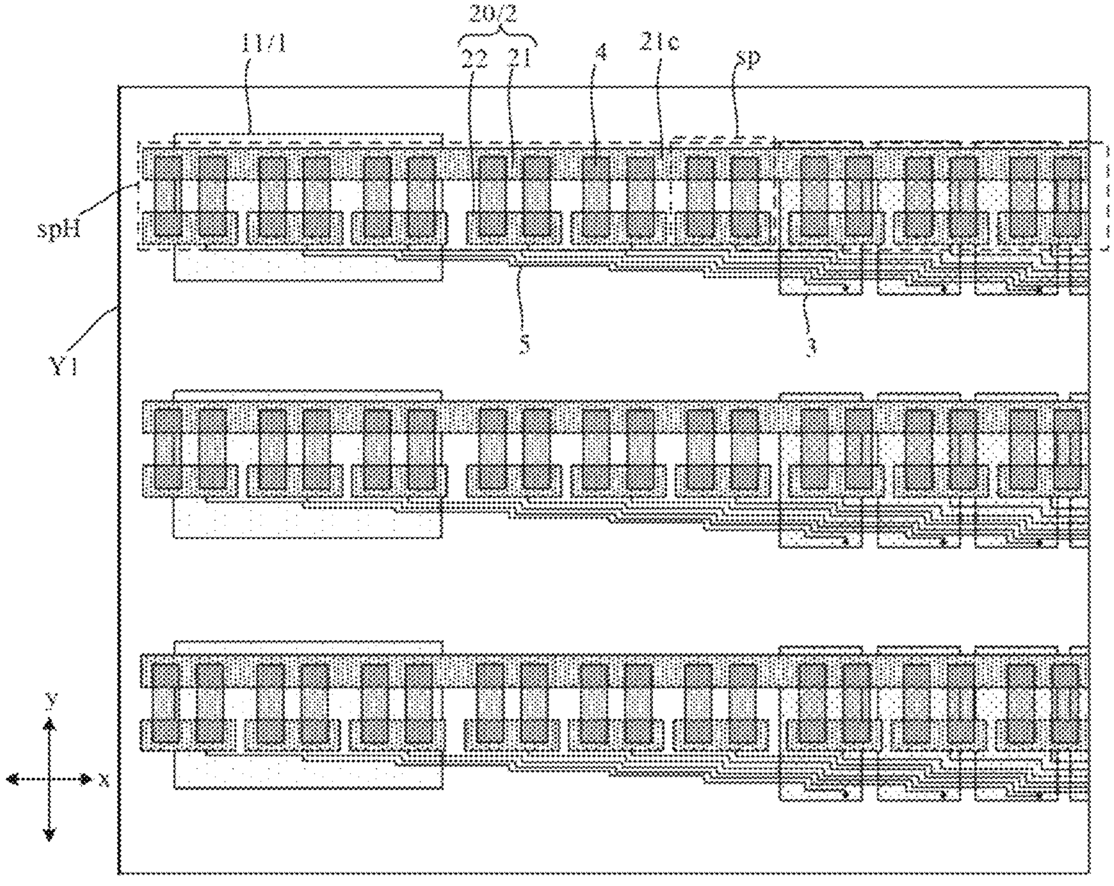
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted. Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, terms such as “center”, “longitudinal”, “lateral”, “length”, “width”, “thickness”, “up”, “down”, “front”, “back”, “left”, “right”, “vertical”, “horizontal”, “top”, “bottom”, “inside”, “outside”, “clockwise”, “counterclockwise”, “axial”, “radial”, “circumferential”, etc., indicate orientations or positional relationships based on the orientations or positional relationships shown in the accompanying drawings, and are only for the convenience of describing the present disclosure and simplifying the description, and do not indicate or imply that the device or element referred to must have a specific orientation, be constructed and operated in a specific orientation, and therefore should not be understood as limiting the present disclosure.

In the present disclosure, relational terms such as first and second are only used to distinguish one entity or operation from another entity or operation, and do not necessarily require or imply any such actual relationship between these entities or operations or order. Moreover, the terms “including”, “comprising” or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence “including . . . ” do not exclude the existence of other same elements in the process, method, article, or equipment that includes the elements.

It should be understood that when describing the structure of a component, when a layer or region is referred to as being “on” or “above” another layer or another region, the layer or region may be directly on the other layer or region, or indirectly on the other layer or region, for example, layers/components between the layer or region and another layer or another region. And, for example, when the component is reversed, the layer or region may be “below” or “under” the other layer or region. In the present disclosure, the term “electrical connection” refers to that two components are directly electrically connected with each other, or the two components are electrically connected via one or more other components.

In the present disclosure, unless otherwise clearly specified and limited, the terms “installed”, “connected”, “fixed” and the like appear, should be understood in a broad sense. For example, it can be a fixed connection, a detachable connection, or an integrated connection; it can be a mechanical connection or an electrical connection; it can be a direct connection or an indirect connection through an intermediate medium, it can be the internal connection of two elements or the interaction relationship between two elements, unless otherwise clearly defined. For those skilled in the art, the specific meanings of the above terms in the present disclosure can be understood according to the specific circumstances.

In the present disclosure, when an element is referred to as being “fixed to” or “disposed on” another element, it may be directly on the other element or there may be an intermediate element. When an element is considered to be “connected to” another element, it may be directly connected to the other element or there may be an intermediate element at the same time. If present, the terms “vertical”, “horizontal”, “upper”, “lower”, “left”, “right” and similar expressions are for illustrative purposes only and are not intended to be the only embodiment.

The present disclosure provides a display panel, including shift registers located on one side of a substrate, a plurality of electrode groups, and a plurality of light-emitting devices. One electrode group of the plurality of electrode groups may include a first electrode and a second electrode. Two terminals of one light-emitting device of the plurality of light-emitting devices may be respectively connected to the first electrode and the second electrode of one corresponding electrode group. The shift registers may be used to achieve row-by-row driving of a plurality of pixel rows on the entire surface. In the present disclosure, a shift register unit may be arranged to overlap with at least one electrode group, thereby reducing the frame to achieve a frameless display, and a certain area of a high-transmittance area may be reserved at the edge of the display panel. Further, the length of the shift register unit in the row direction and the column direction may be designed, or the number of pixel rows driven by the shift register unit may be designed, or the structure of transistors in the shift register unit may be designed, or the drive signal line connected to the shift register unit may be designed. Also, the position of the electrostatic discharge circuit, the length of the electrostatic discharge circuit in the row direction and the column direction, the structure of the transistor in the electrostatic discharge circuit, etc. may also be designed. Also, the connection lines connecting the pixel circuits to the electrode groups near the edge position may also be designed. The pixel circuit setting areas may be configured to include a high-density arrangement area and a low-density arrangement area, and the length of the pixel circuits in the rows and columns in the two arrangement areas may be further differentiated. Therefore, the area of the transmission area in transparent display may be increased to achieve a high-transparency display effect in the edge area.

In one embodiment, the display panel may include a substrate, a driving layer, an electrode layer and light-emitting devices located on one side of the substrate. The driving layer may include shift registers, pixel circuits, and some signal lines. The electrode layer may be located on one side of the driving layer away from the substrate, and the electrode layer may include a plurality of electrode groups. One electrode group may include a first electrode and a second electrode. One light-emitting device may be connected to one corresponding electrode group. Optionally, in one embodiment, the light-emitting device may include a positive electrode and a negative electrode, and the positive electrode of the light-emitting device may be connected to the second electrode, and the negative electrode may be connected to the first electrode. In one embodiment, the light-emitting device may be a Micro-LED or a Mini-LED.

As shown in FIG. 1 which is a schematic diagram of a display panel consistent with the present disclosure, in one embodiment, the shift register 1 may include a plurality of cascaded shift register units 11. The plurality of shift register units 11 in the shift register 1 may be arranged in a first direction y. The display panel may have a first edge Y1 extending along the first direction y, and the pixel circuits 3 may be disposed on a side of the shift register 1 away from the first edge Y1. The electrode layer 2 may include a plurality of electrode groups 20, and one electrode group 20 may include a first electrode 21 and a second electrode 22. In one light-emitting device 4, one terminal may be connected to one first electrode 21 of one corresponding electrode group, and the other terminal may be connected to one second electrode 22 of the corresponding electrode group. One electrode group 20 may be used to connect at least one light-emitting device 4. For example, in one embodiment shown in FIG. 1, one electrode group 20 may be connected to two light-emitting devices 4. Second electrodes 22 may be block-shaped, and first electrodes 21 arranged in the second direction x may be connected to each other to form a common electrode 21*c*. The first electrodes 21 in the plurality of electrode groups 20 may overlap with the second electrodes 22 in the first direction y. That is, the portion of the common electrode 21*c* that overlaps with the second electrode 22 in the first direction y may be the first electrode 21. The first direction y and the second direction x may intersect each other. For example, in one embodiment, the first direction y may be the column direction and the second direction x may be the row direction. FIG. 1 also illustrates connection lines 5, and one second electrode 22 in one electrode group 20 at the edge area of the display panel and near the first edge Y1 may be connected to one corresponding pixel circuit 3 through one corresponding connection line 5.

FIG. 1 is a partial top view of the display panel, and the substrate is not shown in FIG. 1. It can be understood that the direction perpendicular to the plane where the substrate is located is parallel to the top view direction. It can be seen from FIG. 1 that one shift register unit 11 may overlap at least partially with at least one electrode group 20 in the direction perpendicular to the plane where the substrate is located. Optionally, the shift register unit 11 may overlap with the second electrode 22 in the at least one electrode group 20 in the direction perpendicular to the plane where the substrate is located, or the shift register unit 11 may overlap with the first electrode 21 and the second electrode 22 in the at least one electrode group 20. Further, since the electrode group 20 is connected to at least one light-emitting device 4, it may also be said that the shift register unit 11 overlaps at least partially with at least one light-emitting device 4 in the direction perpendicular to the plane where the substrate is located. That is, at least part of the shift register unit 11 is located in the display area.

In the display panel, the shift register unit 11 may be connected to the pixel circuits 3 through scan lines (not shown in FIG. 1), and one scan line may be connected to a pixel circuit row extending in the first direction x. A plurality of pixel circuit rows may be driven row by row through the shift register 1 to drive the plurality of pixel rows to display row by row. In existing technologies, the shift register unit 11 is usually arranged on one side of the pixel circuits 3 close to the edge of the display panel, and is located in the border area.

In the display panel provided by the present disclosure, one shift register unit 11 may be arranged to overlap at least partially with at least one electrode group 20, such that at least part of the shift register unit 11 is located in the display area, thereby reducing the border to realize borderless display. And, a certain area of the transparent area (that is, the area where the plurality of shift register units 11 and other circuits are not arranged) may be reserved between the plurality of electrode groups 20 adjacent to each other in the column direction, such that the edge position of the display panel has a certain transmittance. The display panel provided by the present disclosure may be applied to transparent display to achieve a display effect of borderless and high edge transparency.

Figure 2:
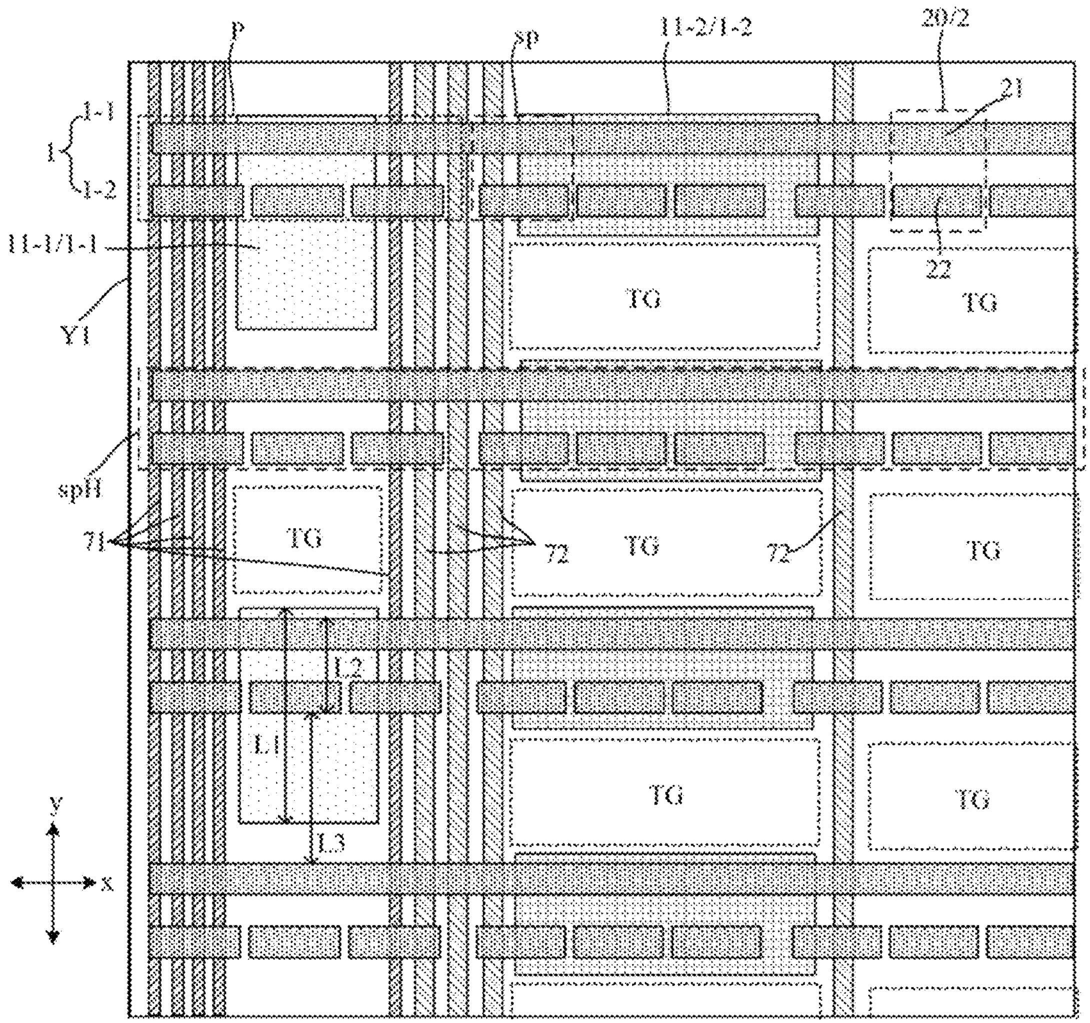
FIG. 2 illustrates another exemplary display panel consistent with various disclosed embodiments in the present disclosure.

In some other embodiments shown in FIG. 2 which illustrates another exemplary display panel consistent with various embodiments of the present disclosure (the light-emitting devices and the pixel circuits are not shown in FIG. 2 to clearly show the positional relationship between the shift registers and the electrode groups), one shift register 1 may include a first shift register 1-1. The first shift register 1-1 may include a plurality of cascaded first shift register units 11-1. The plurality of first shift register units 11-1 may be arranged along the first direction y. A length of one of the plurality of first shift register units 11-1 along the first direction y may be larger than a length of the one of the plurality of first shift register units 11-1 along the second direction x.

The plurality of first shift register units 11-1 are shown in FIG. 2 simplified. One first shift register unit 11-1 of the plurality of first shift register units 11-1 may include a plurality of transistors. When measuring the length of the first shift register unit 11-1 along the first direction y, edges of one outermost transistor of its overall structure may be used as the boundary. The same may be true when measuring the length of the first shift register unit 11-1 along the second direction x. That is, a rectangle may be drawn at the location of the first shift register unit 11-1, where the long side of the rectangle extends along the first direction y and the short side extends along the second direction x, such that all transistors and capacitors of the first shift register unit 11-1 are located in the rectangle. The long side of the rectangle may be used as the length of the first shift register unit 11-1 in the first direction y, and the short side may be used the length of the first shift register unit 11-1 in the second direction x. When the following embodiments involve the length of a second shift register unit or the length of the electrostatic discharge circuit along the first direction y/the second direction x, they may all be understood by referring to the above description.

In conjunction with FIG. 1, the shift register unit 11 may be arranged to overlap with at least one electrode group 20, that is, the shift register unit 11 may be at least partially arranged in the display area, and the corresponding pixel circuit 3 may need to be retracted (that is, shifted away from the edge direction of the display panel) to leave a position where the shift register unit 11 is arranged. This may also cause the retracted pixel circuit 3 and the electrode group 20 connected thereto to be misaligned. It can be seen from FIG. 1 that the electrode groups 20 near the edge of the display panel and the pixel circuits 3 may be misaligned in the second direction x, and the second electrodes 22 in the electrode groups 20 may need to be connected to the pixel circuits 3 through the connecting lines 5. When the retraction displacement of the pixel circuits 3 relative to the edge in the second direction x is larger, more electrode groups 20 may be misaligned with the pixel circuits 3, and more connecting lines 5 may need to be arranged accordingly, which may increase the area occupied by the connecting lines 5.

In the present embodiment, the length of the first shift register unit 11-1 in the first direction y may be set to be larger than its length in the second direction x, and the width occupied by the first shift register unit 11-1 in the second direction x may be smaller. Therefore, the number of pixel circuits 3 that are retracted in the second direction x may be smaller, which is beneficial to reducing the number of connection lines 5, thereby saving wiring space. When used in transparent display, the area of the transmission area may be increased, improving the transparent display effect.

FIG. 2 also illustrates a first group of drive signal lines 71 connected to the first shift registers 1-1, and the first group of drive signal lines 71 may at least include a first start signal line, a clock signal line, and a power signal line. The position of the first group of drive signal lines 71 in FIG. 2 is only schematically shown.

In some embodiments, the display panel may be a transparent display panel. As shown in FIG. 2, three electrode groups 20 arranged in the second direction x may form one pixel area P. The display panel may include a plurality of transmission areas TG. One transmission area TG may be an area through which light is able to pass or an area whose light transmittance is larger than the light transmittance of other areas, and no metal wire may be set in the transmission area TG to ensure the transmittance of the area. At least a portion of the transmission areas TG may be disposed between the adjacent pixel areas P in the first direction y, such that transparent display is achieved. The design of the embodiments of the present disclosure may be applied in the transparent display, and the shift register unit 11 may be set to overlap at least partially with at least one electrode group 20, to achieve a display effect without a border and high edge transparency.

Optionally, in one embodiment, the transmission areas may include transmission areas of different sizes, or transmission areas of different shapes.

Figure 3:
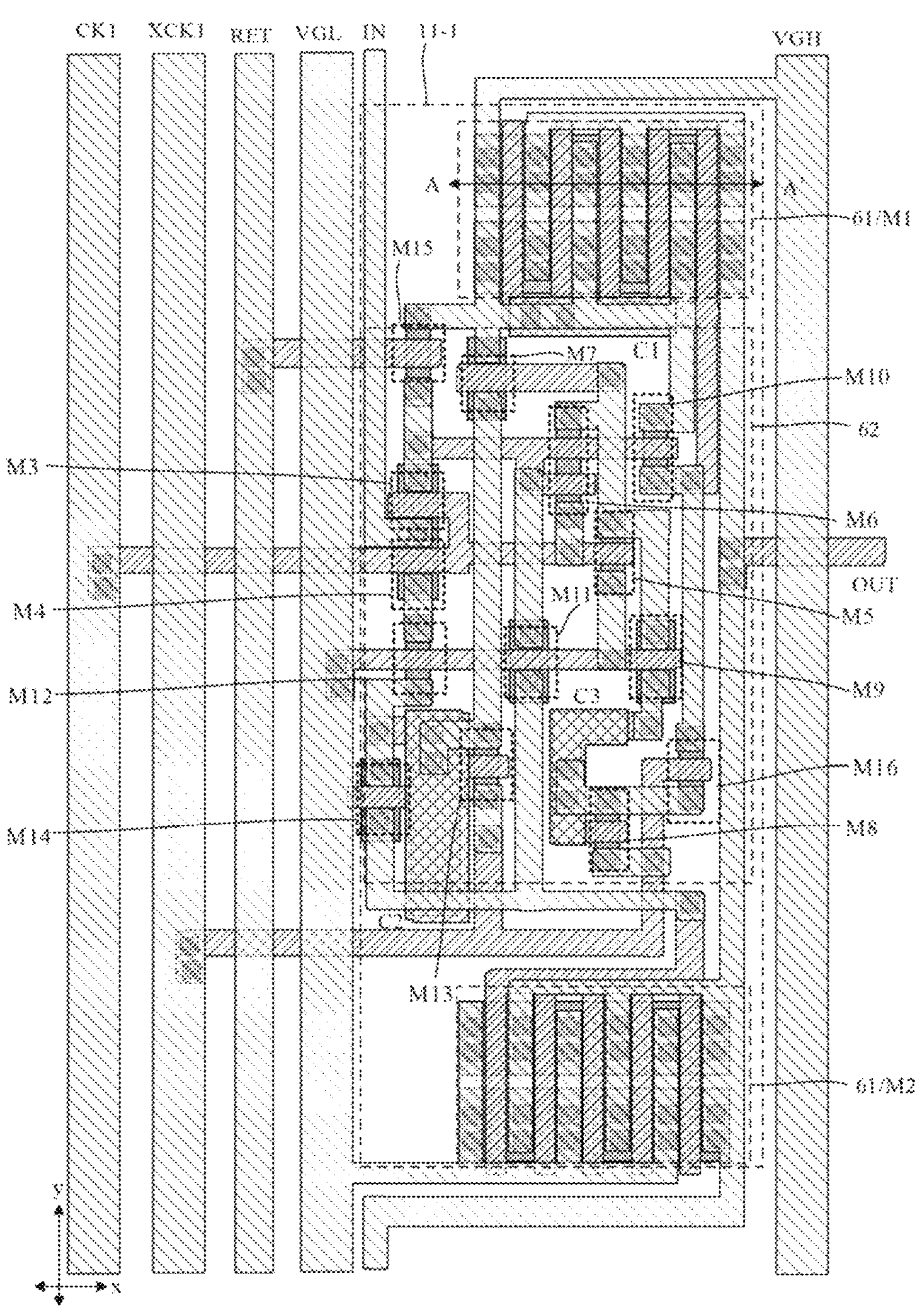
FIG. 3 illustrates a local structure of another exemplary display panel consistent with various disclosed embodiments in the present disclosure.
Figure 4:
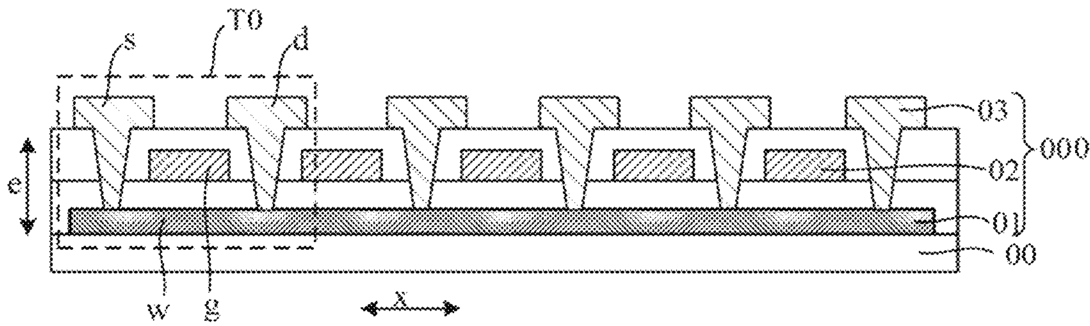
FIG. 4 illustrates a cross-sectional view of an exemplary display panel along a A-A' direction in FIG. 3, consistent with various disclosed embodiments in the present disclosure.

In some embodiments as shown in FIG. 3 which illustrates a partial view of another exemplary display panel and FIG. 4 which is a cross-sectional view along the A-A' direction in FIG. 3, the first shift register unit 11-1 may include a first output module 61 and a first switch module 62. The first output module 61 may include a first output transistor M1 and a second output transistor M2. The channel width directions of the transistors in the first output module 61 may be parallel to the first direction y, and the channel length directions of the transistors in the first output module 61 may be parallel to the second direction x. In conjunction with FIG. 4, the first output transistor M1 may include a plurality of first sub-transistors TO connected in parallel. One first sub-transistor TO may include an active layer w, a gate g, a source s, and a drain d. Two parallel and adjacent first sub-transistors TO may have a common electrode, and the common electrode may be the drain of one of the adjacent first sub-transistors TO which is multiplexed as the source of another first sub-transistor TO. In one first sub-transistor TO, along the direction e perpendicular to the plane where the substrate 00 is located, the area in the active layer w that overlaps with the gate g may be the channel of the transistor. The direction from the source s to the drain d may be the length direction of the channel, and the direction perpendicular to the length direction of the channel may be the width direction of the channel.

In the present embodiment, the channel width directions of the transistors in the first output module 61 may be set to be parallel to the first direction y, and the channel length directions of the transistors may be parallel to the second direction x, such that the transistors in the first output module 61 have a larger width-to-length ratio while occupying a smaller space in the second direction x to meet the output performance of the first output module 61.

As shown in FIG. 4, the display panel may also include a driving layer 000 located on the substrate 00. The driving layer 000 may at least include a semiconductor layer 01, a first metal layer 02, and a second metal layer 03. The active layer w of one transistor may be located in the semiconductor layer 01, the gate g may be located in the first metal layer 02, and the source s and the drain d may be located in the second metal layer 03.

In some embodiments, as shown in FIG. 3, in the first shift register unit 11-1, along the first direction y, the first switch module 62 may be located between the first output transistor M1 and the second output transistor M2. By such arrangement, the length of the first shift register unit 11-1 in the first direction y may be larger than its length in the second direction x, and the length of the first shift register unit 11-1 in the second direction x may be smaller while ensuring the output performance of the first output module 61. In the present embodiment, the number of the pixel circuits 3 retracted in the second direction x may be reduced, which is conducive to reducing the number of the connection lines 5 and thereby saving wiring space. When applied in transparent display, the area of the transmission area may be increased, improving the transparent display effect.

Figure 5:
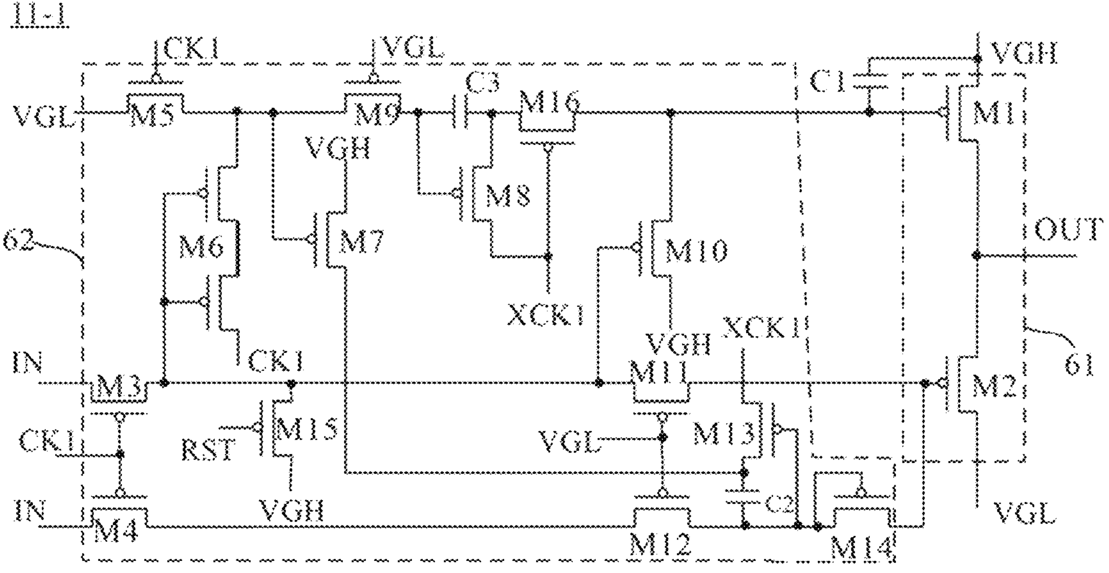
FIG. 5 illustrates an exemplary first shift register unit consistent with various disclosed embodiments in the present disclosure.

In some embodiments shown in FIG. 4 and FIG. 5 which is a schematic diagram of the first shift register unit, the first switch module 62 in the first shift register unit 11-1 may include a first switch tube M3, a second switch tube M4, a third switch tube M5, a fourth switch tube M6, a fifth switch tube M7, a sixth switch tube M8, a seventh switch tube M9, an eighth switch tube M10, a ninth switch tube M11, a tenth switch tube M12, an eleventh switch tube M13, a twelfth switch tube M14, a thirteenth switch tube M15, and a fourteenth switch tube M16. The first shift register unit 11-1 may also include a first capacitor C1, a second capacitor C2, and a third capacitor C3. The input terminal IN of the first shift register unit 11-1 may be connected to the output terminal OUT of the first shift register unit 11-1 of the previous level, and the input terminal IN of the first level first shift register unit 11-1 may be connected to the first start signal. The first clock signal CK1, the second clock signal XCK1, the first power signal VGH, the second power signal VGL, and the first reset signal RST may be also required to drive the first shift register unit 11-1.

In one embodiment of the present disclosure, the display panel may also include a plurality of sub-pixels located on one side of the substrate. As shown in FIG. 1 and FIG. 2, one sub-pixel sp may include one electrode group 20, and the plurality of sub-pixels sp may be arranged into a pixel row spH in the second direction x. FIG. 1 also illustrates the light-emitting devices 4 in the sub-pixel sp. The driving layer of the display panel may include a plurality of first scan lines, and one first scan line may connect the plurality of sub-pixels sp in one pixel row spH. That is, one first scan line may connect the plurality of pixel circuits 3 corresponding to one corresponding pixel row spH.

Figure 6:
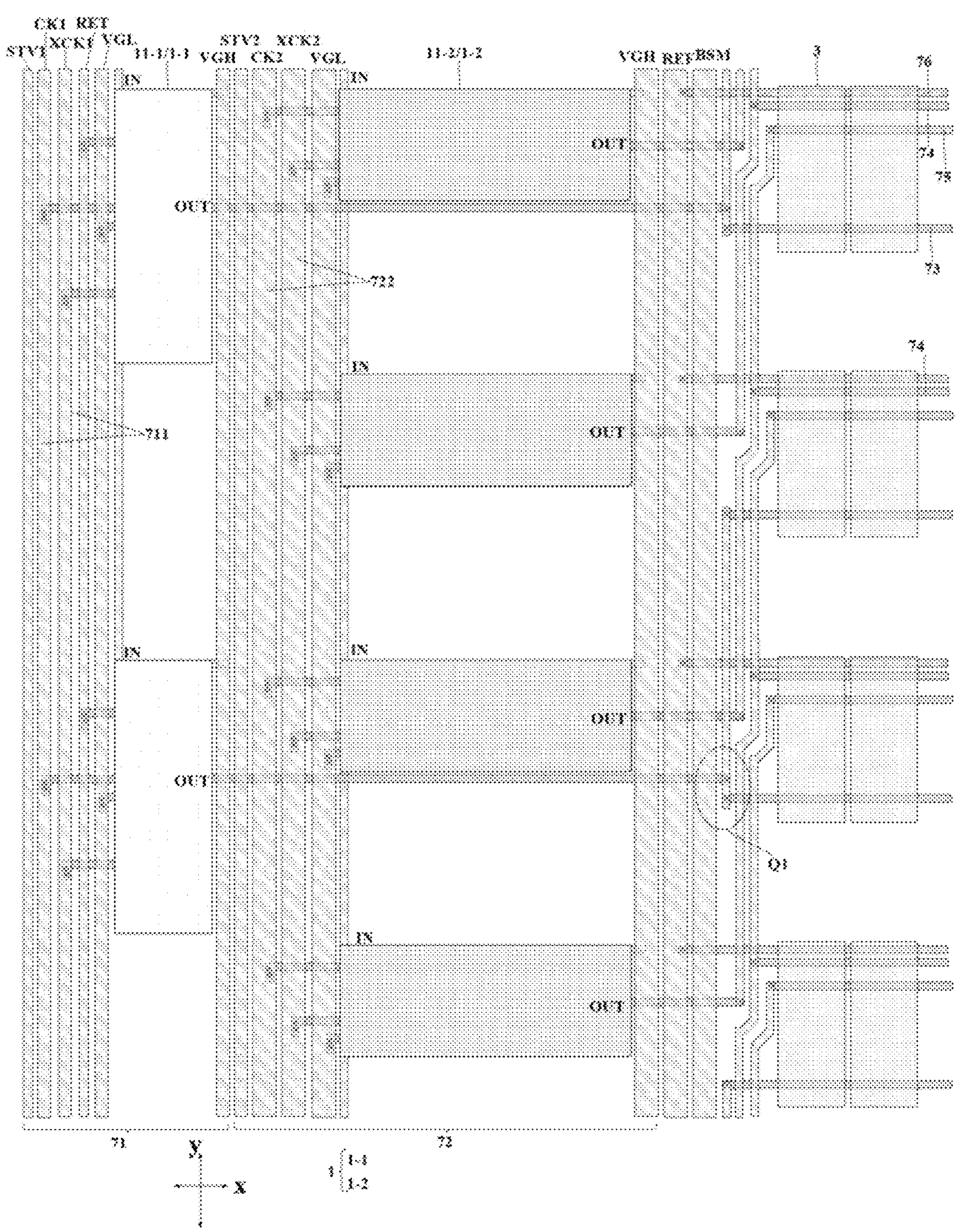
FIG. 6 illustrates a local view of another exemplary display panel consistent with various disclosed embodiments in the present disclosure.

FIG. 6 is a partial schematic diagram of another display panel, and illustrates the setting of the shift register 1 at the edge of the display panel and some wiring. FIG. 6 does not illustrate the electrode groups 20 and the light-emitting devices 4. In one embodiment shown in FIG. 6, the display panel may include a plurality of first scan lines 73, and the plurality of first scan lines 73 may be connected to the plurality of pixel circuits 3 arranged in the second direction x. FIG. 6 only shows the simplified pixel circuits 3, and the optional structure of the pixel circuits 3 will be described in the following related embodiments. As shown in the position of region Q1 in FIG. 6, the line drawn from the output end OUT of the first shift register unit 11-1 may be pulled rightward and upward to connect to two first scan lines 73, that is, one first shift register unit 11-1 may drive two pixel rows spH and the first shift register unit 11-1 may be driven in a one-drive-two manner.

In the embodiment shown in FIG. 6 and FIG. 2, only one first shift register unit 11-1 may need to be set for two pixel rows spH. Therefore, the space occupied by the first shift register 1-1 may be reduced. In the present embodiment, the length of the first shift register unit 11-1 in the first direction y may be set to larger than its length in the second direction x, to reduce the area occupied by the first shift register unit 11-1 in the second direction x, thereby reducing the retracted distance of the pixel circuits 3 and reducing the number of arranged connecting lines. Further, the output terminal OUT of one first shift register unit 11-1 may be set to connect two first scan lines 73, which may reduce the number of first shift register units 11-1 when the number of pixel rows spH is determined. Although the length of the first shift register unit 11-1 in the first direction y is relatively large, by reducing the number of first shift register units 11-1 arranged in the first direction y, a larger transmission area may be provided between adjacent first shift register units 11-1. Application in transparent display may not only realize borderless display, but also realize a high-transparency display effect in the edge area.

Optionally, in one embodiment, the line led out from the output terminal OUT of the first shift register unit 11-1 may be pulled rightward and upward, that is, the line led out from the output terminal OUT of the first shift register unit 11-1 may be the lead line along the second direction X and the lead line along the first direction Y, where the lead line along the second direction X is arranged in the same layer as the first scan line 73 and the lead line along the first direction Y is arranged in the same layer as the signal line of the first direction Y (such as the first clock signal CK1, the second clock signal XCK1, the first power signal VGH, the second power signal VGL, etc.)

In some embodiments, as shown in FIG. 2, the length of the first shift register unit 11-1 in the second direction x may be smaller than the length of the three electrode groups 20 arranged continuously in the second direction x. Such an arrangement may make the length occupied by the first shift register unit 11-1 in the second direction x smaller, and accordingly, the distance that the pixel circuits 3 needs to be retracted because of the arrangement of the first shift register unit 11-1 overlapping the electrode groups 20 may also be smaller. Therefore, an excessive number of connecting lines 5 may be prevented, which is beneficial to saving wiring space in the edge area of the display panel, such that the edge area has a larger area of the transparent area.

In some embodiments, as shown in FIG. 2, the length of the first shift register unit 11-1 in the first direction y is L1, L1<L2+L3, where L2 is the length of the electrode groups 20 in the first direction y, and L3 is the spacing distance between two adjacent electrode groups 20 in the first direction y. When the length of the first shift register unit 11-1 in the first direction y is set to be larger than its length in the second direction x, and the first shift register unit 11-1 overlaps with at least one electrode group 20, further setting L1<L2+L3 may save wiring space at the edge position of the display panel. Therefore, a larger area of the transparent area may still be left at the edge position of the display panel to achieve a high-transparency display effect at the transparent display edge.

In some embodiments, as shown in FIG. 2, along the first direction y, the spacing between two adjacent first shift register units 11-1 may be larger than the spacing between two adjacent electrode groups 20. In other words, along the first direction y, the spacing between two adjacent first shift register units 11-1 may be larger than the spacing between two adjacent pixel rows spH. The spacing between two adjacent first shift register units 11-1 may be the spacing distance between the edges of the two first shift register units 11-1, and the spacing between two adjacent pixel rows spH may be the spacing distance between the edges of the two pixel rows spH. In the present embodiment, the length of the first shift register unit 11-1 in the first direction y may be set to be larger than its length in the second direction x, and the two adjacent first shift register units 11-1 overlap with at least one electrode group 20 respectively. Further, the spacing between the two adjacent first shift register units 11-1 along the first direction y may be limited, such that a transparent area TG may be reserved between the two adjacent first shift register units 11-1 in the first direction y to achieve a display effect of high transparency of the transparent display edge.

In some embodiments, the first group of drive signal lines may be connected to the first shift registers 1-1. As can be seen from the top view in FIG. 2, one signal line in the first group of drive signal lines 71 may extend along the first direction y. Along the direction perpendicular to the plane where the substrate is located, at least one line in the first group of drive signal lines 71 may overlap at least partially with one corresponding electrode group 20. Such a setting may further reduce the frame and achieve a borderless display.

FIG. 2 shows that the first electrode 21 and the second electrode 22 in one electrode group 20 are arranged along the first direction y, and at least one line in the first group of drive signal lines 71 overlaps with the first electrode 21 and the second electrode 22 in the electrode group 20.

Figure 7:
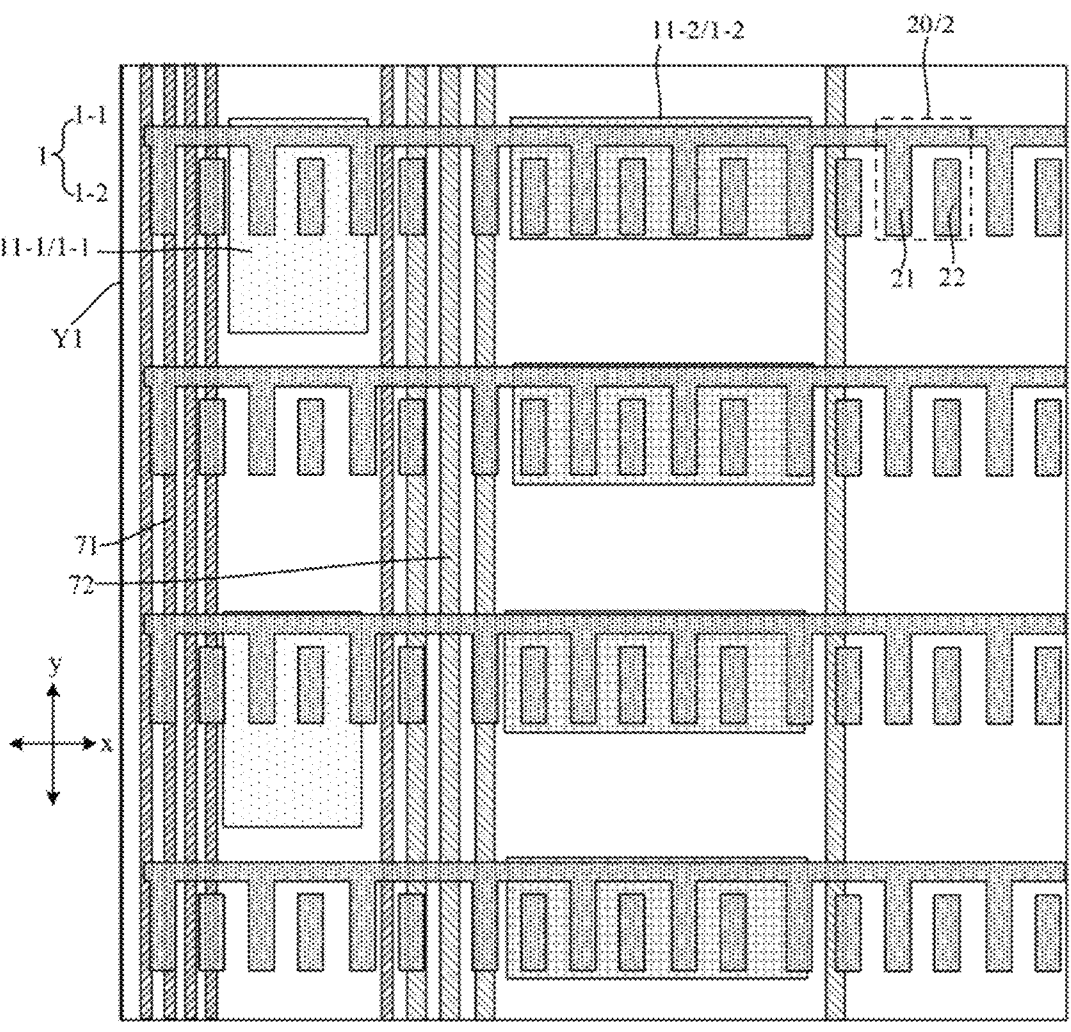
FIG. 7 illustrates another exemplary display panel consistent with various disclosed embodiments in the present disclosure.

In other embodiments shown in FIG. 7 which is a schematic diagram of another display panel, the first electrode 21 and the second electrode 22 in one electrode group 20 may be arranged along the second direction x, that is, the first electrode 21 and the second electrode 22 in one electrode group 20 may overlap in the second direction x. Along the direction perpendicular to the plane where the substrate is located, at least one line in the first group of drive signal lines 71 may overlap at least partially with the corresponding electrode group 20. Optionally, at least one line in the first group of drive signal lines 71 may overlap with the first electrode 21, or at least one line in the first group of drive signal lines 71 may overlap with the second electrode 22.

FIG. 1 shows that the first electrode 21 and the second electrode 22 in one electrode group 20 are arranged along the first direction y, and one electrode group 20 includes a position for binding two light-emitting devices 4, which is equivalent to providing a redundant position in the sub-pixel. For example, firstly, a light-emitting device 4 may be bound to one electrode group 20. When the light-emitting device 4 has a defect and cannot emit light normally, another light-emitting device 4 may be bound to the redundant position such that the sub-pixel is able to emit light normally. In this way, the two light-emitting devices 4 may be finally bound to the electrode group 20, and the two light-emitting devices 4 may be arranged along the second direction x.

Optionally, in another embodiment, the first electrode 21 and the second electrode 22 in one electrode group 20 may be arranged along the first direction y, and one electrode group 20 may include a position for binding two light-emitting devices 4, which is equivalent to providing a redundant position in the sub-pixel. For example, one light emitting device 4 may be bound to the electrode group 20 first. When the light emitting device 4 has defects and cannot emit light normally, another light emitting device 4 may be bound to the redundant position such that the sub-pixel is able to emit light normally, and the original light emitting device may be removed at the same time such that there is only one light emitting device 4 bound to the electrode group 20.

Optionally, in another embodiment, the first electrode 21 and the second electrode 22 in one electrode group 20 may be arranged along the first direction y, and one electrode group 20 may include a position for binding two light-emitting devices 4, which is equivalent to providing a redundant position in the sub-pixel. For example, one light emitting device 4 may be bound to the electrode group 20, such that there is only one light emitting device 4 bound to the electrode group 20.

FIG. 7 provides another arrangement of the electrode groups 20. It can be understood that in the embodiment shown in FIG. 7, when a redundant position is set on the electrode group 20, the electrode group 20 may also include a position for binding two light emitting devices 4, and the corresponding two light emitting devices 4 on the electrode group 20 may be arranged along the first direction y.

Optionally, in yet another embodiment, one electrode group 20 may include a position for binding one light-emitting device 4. For example, one light emitting device 4 may be bound to the electrode group 20. When the light emitting device 4 has defects and cannot emit light normally, the light emitting device 4 at the original position may be removed and another light emitting device 4 may be bound to the original position such that the sub-pixel is able to emit light normally and there is only one light emitting device 4 bound to the electrode group 20.

Figure 8:
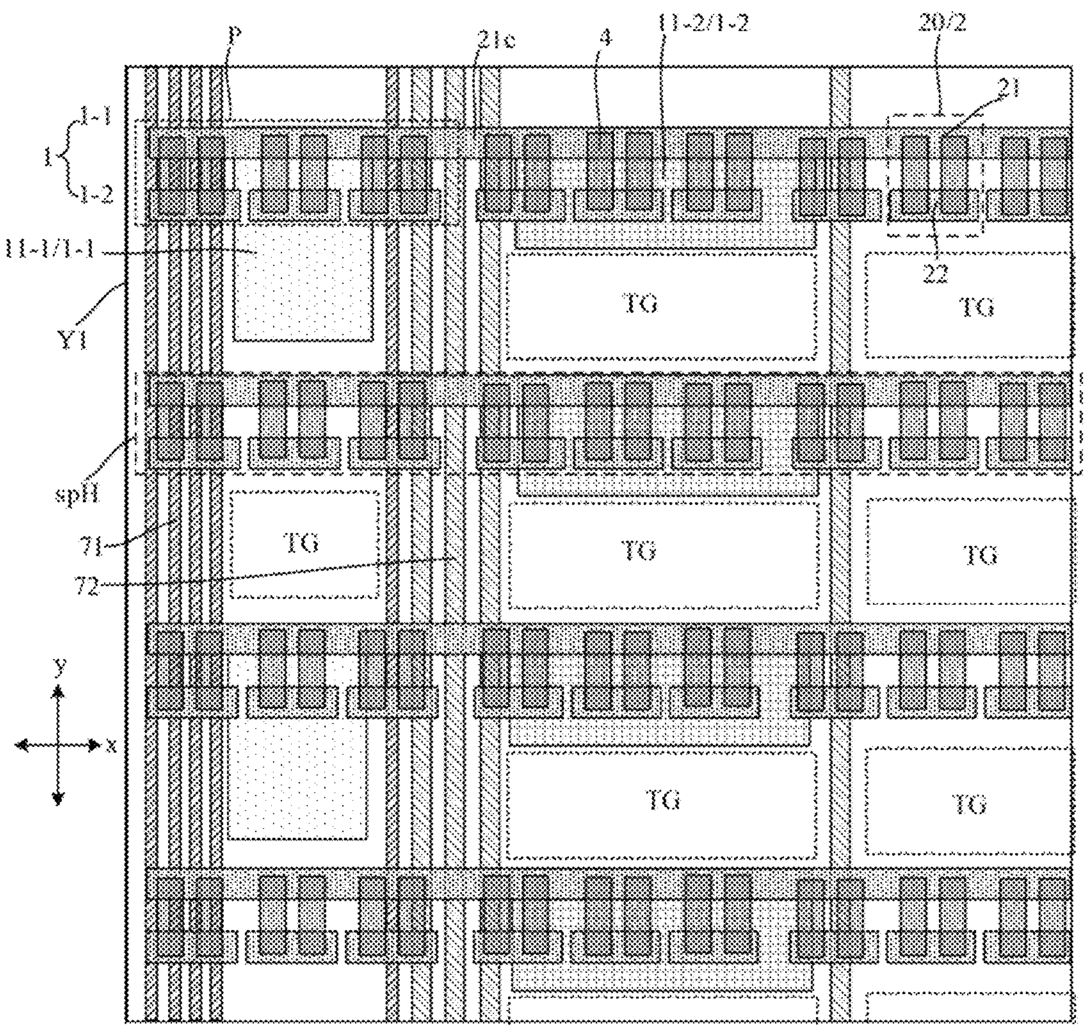
FIG. 8 illustrates a local view of another exemplary display panel consistent with various disclosed embodiments in the present disclosure.

In some embodiments shown in FIG. 8 which is a partial schematic diagram of another display panel, the plurality of first electrodes 21 arranged in the second direction x may be connected to each other to form the common electrode 21*c*. In a plurality of electrode groups 20 arranged along the second direction x, the second electrodes 22 may be located on one side of the common electrode 21*c* in the first direction y. Along the plane direction perpendicular to the substrate, the first shift register unit 11-1 may overlap with the second electrode 22 and the common electrode 21*c*. The edge of the first shift register unit 11-1 may be flush with the edge of the common electrode 21*c* away from the second electrode 22. Such a setting may maximize the overlapping area of the first shift register unit 11-1 and the electrode group 20 and minimize the length occupied by the first shift register unit 11-1 and the electrode group 20 in the first direction y. Therefore, a larger area of the transmission area TG may be reserved in the edge area of the display panel, and a high-transparency display effect of the edge of the transparent display may be achieved.

In some embodiments, as shown in FIG. 2, the shift register 1 may include a second shift register 1-2, and the second shift register 1-2 may include a plurality of cascaded second shift register units 11-2. The plurality of second shift register units 11-2 may be arranged along the first direction y. The length of one second shift register unit 11-2 in the first direction y may be less than its length in the second direction x. FIG. 2 only shows the simplified second shift register unit 11-2, and the actual second shift register unit 11-2 may include a plurality of transistors. When measuring the length of the second shift register unit 11-2 along the first direction y, the edge of the outermost transistor of its overall structure may be used as the boundary. The same is true when measuring the length of the second shift register unit 11-2 along the second direction x. This embodiment may enable the second shift register unit 11-2 to overlap with at least two electrode groups 20 arranged in the second direction x, and enable the second shift register unit 11-2 and the electrode groups 20 overlapping therewith to occupy a smaller total length in the first direction y. The second shift register unit 11-2 may be set to overlap with the corresponding electrode groups 20 in the transparent display, so as not to occupy the width of the transmission area in the first direction y as much as possible, thereby ensuring the area of the transmission area and improving the transparent display effect.

FIG. 2 also illustrates a second group of drive signal lines 72 connected to the second shift register 1-2, and the second group of drive signal lines 72 may at least include a second start signal line, a clock signal line, and a power signal line. The position of the second group of drive signal lines 72 in FIG. 2 is only schematically shown. In FIG. 2, to distinguish the first group of drive signal lines 71 from the second group of drive signal lines 72, the two groups are filled with different patterns. In fact, the two groups may be made of the same layer or the same material.

Figure 9:
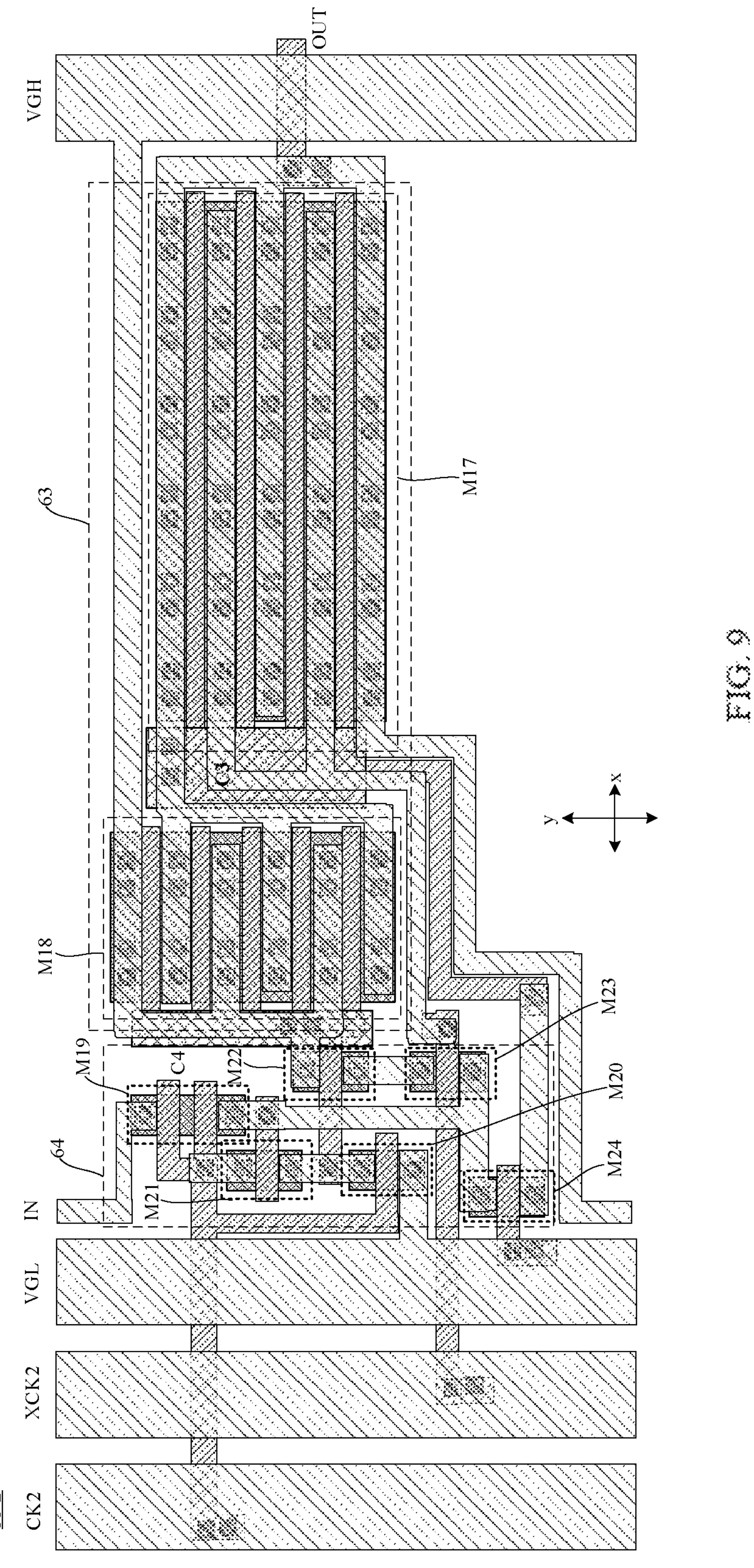
FIG. 9 illustrates an exemplary second shift register unit consistent with various disclosed embodiments in the present disclosure.

In some embodiments shown in FIG. 9 which is a schematic diagram of a second shift register unit, the second shift register unit 11-2 may include a second output module 63 and a second switch module 64. The second output module 63 may include a third output transistor M17 and a fourth output transistor M18. In combination with the description of the transistors in the first output module 61 and the channel width direction and channel length direction of the transistors in the embodiments of FIG. 3 and FIG. 4, it may be understood that the third output transistor M17 and the fourth output transistor M18 among the transistors in the second output module 63 may respectively have a structure of multiple sub-transistors in parallel. The channel length direction of the transistors in the second output module 63 may be parallel to the first direction y, and the channel width direction of the transistors in the second output module 63 may be parallel to the second direction x. Such a setting may ensure that the transistors in the second output module 63 have a larger width-to-length ratio when the second shift register unit 11-2 occupies a smaller space in the first direction y, to meet the requirement for the output performance of the second output module 63.

In some embodiments, as shown in FIG. 9, the second switch module 64 and the second output module 63 in the second shift register unit 11-2 may be arranged along the second direction x. Such a configuration may make the length of the second shift register unit 11-2 in the first direction y smaller than its length in the second direction x. And, when the second shift register unit 11-2 is configured to overlap with at least one electrode group 20, the total length occupied by the overlapping second shift register unit 11-2 and the electrode group 20 in the first direction y may be smaller. Application in transparent display may increase the transmittance of the edge area and achieve a high-transmittance display effect in the edge area.

Figure 10:
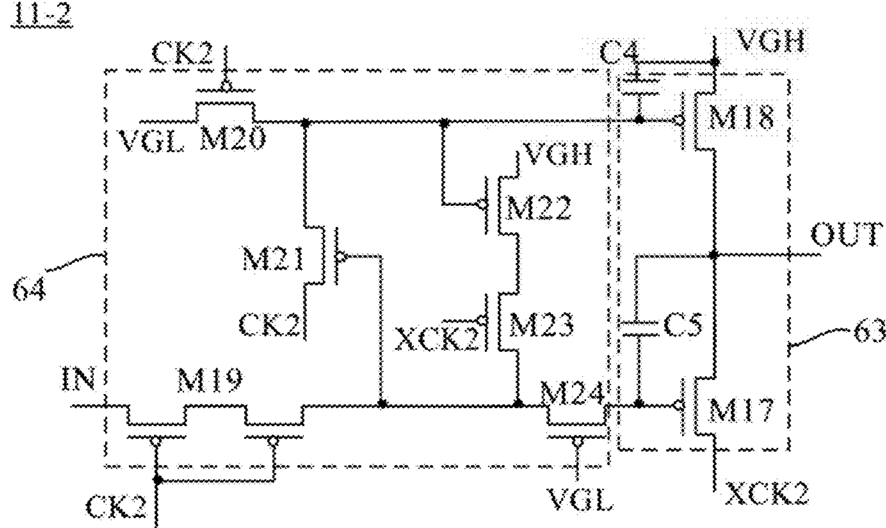
FIG. 10 illustrates another exemplary second shift register unit consistent with various disclosed embodiments in the present disclosure.

FIG. 10 is a schematic diagram of a second shift register unit. As shown in FIG. 9 and FIG. 10, in another embodiment, the second output module 63 in the second shift register unit 11-2 may include a third output transistor M17 and a fourth output transistor M18, and the second switch module 64 may include a fifteenth transistor M19, a sixteenth transistor M20, a seventeenth transistor M21, an eighteenth transistor M22, a nineteenth transistor M23, and a twentieth transistor M24. The second shift register unit 11-2 may also include a fourth capacitor C4 and a fifth capacitor C5. The input terminal IN of the second shift register unit 11-2 may be connected to the output terminal OUT of the second shift register unit 11-2 of the previous level, and the input terminal IN of the second shift register unit 11-2 of the first level may be connected to the second start signal. The third clock signal CK2, the fourth clock signal XCK2, the first power supply signal VGH, and the second power supply signal VGL may also be required to drive the second shift register unit 11-2. The first power signal VGH and the second power signal VGL may both be constant voltage signals, and the voltage value of the first power signal VGH may be larger than the voltage value of the second power signal VGL. The first power signal VGH may be a high level signal, and the second power signal VGL may be a low level signal.

In some embodiments, one electrode of the third output transistor M17 may be connected to the second power signal VGL, and when the third output transistor M17 is turned on, it may provide a low level signal in the second power signal VGL to the output terminal OUT of the second shift register unit 11-2 as an enable signal for driving the pixel circuit. As shown in FIG. 7, the channel width-to-length ratio of the third output transistor M17 may be set to be greater than the channel width-to-length ratio of the fourth output transistor M18, ensuring that the output performance of the second shift register unit 11-2 meets the driving requirements.

In some embodiments, as shown in FIG. 6, the display panel may include a first group of drive signal lines 71 and a second group of drive signal lines 72. The first shift register 1-1 may be connected to the first group of drive signal lines 71, and the second shift register 1-2 may be connected to the second group of drive signal lines 72. The first group of drive signal lines 71 may include a first group of clock signal lines 711, and the first group of clock signal lines 711 may include a first clock signal line CK1 and a second clock signal line XCK1. The first group of drive signal lines 71 may also include a first start signal line STV1, a first power signal line VGH, a second power signal line VGL, and a first reset signal line RST. In the present disclosure, one signal line and the signal provided by it use the same mark, such as, the first clock signal line CK1 and the first clock signal CK1 use the same mark. The second group of drive signal lines 72 may include a second group of clock signal lines 722 including a third clock signal CK2 and a fourth clock signal XCK2, and the second group of drive signal lines 72 may also include a second start signal line STV2, a first power signal line VGH, and a second power signal line VGL.

The line width of the second group of clock signal lines 722 may be larger than the line width of the first group of clock signal lines 711. When the first shift register 1-1 provides a light-emitting control signal and the second shift register 1-2 provides a scanning control signal, the output signal of the second shift register 1-2 may have a higher requirement for signal delay. Increasing the line width of the second group of clock signal lines 722 may reduce the voltage drop on the second group of clock signal lines 722 and meet the signal delay requirement of the output signal of the second shift register 1-2. Making the line width of the first group of clock signal lines 711 relatively narrow may be beneficial to saving space in the second direction x, thereby reducing the distance of the pixel circuits retracting and reducing the number of connection lines.

In some embodiments, the second group of clock signal lines 722 may adopt a double-layer routing setting, that is, the third clock signal CK2 and the fourth clock signal XCK2 may be respectively made of two metal layers, such that the voltage drop of the second group of clock signal lines 722 may be further reduced, and the delay of the output signal of the second shift register 1-2 may be further reduced.

In some embodiments, as shown in FIG. 6, the line widths of the first power signal line VGH and the second power signal line VGL in the second group of drive signal lines 72 may be larger than the line widths of the first power signal line VGH and the second power signal line VGL in the first group of drive signal lines 71. Such a setting may ensure the signal delay requirement of the output signal of the second shift register 1-2.

In some embodiments, it can be seen from the top view shown in FIG. 8 that the second shift register unit 11-2 may overlap with the second electrode 22 and the common electrode 21*c* in the direction perpendicular to the plane where the substrate is located. The edge of the second shift register unit 11-2 may be flush with the edge of the common electrode 21*c* away from the second electrode 22. Such a setting may maximize the overlapping area of the second shift register unit 11-2 and the electrode group 20 overlapping therewith, and minimize the length occupied by the second shift register unit 11-2 and the electrode group 20 overlapping therewith in the first direction y. Therefore, a larger area of the transmission area TG may be reserved between two adjacent pixel areas P, and a high-transparency display effect of the edge of the transparent display may be achieved.

In some embodiments, the display panel may further include a plurality of second scan lines. In conjunction with FIG. 1, one second scan line may connect the plurality of sub-pixels sp in one pixel row spH. That is, one second scan line may connect a plurality of pixel circuits 3 corresponding to one pixel row spH. FIG. 6 shows the plurality of second scan lines 74. As can be seen from FIG. 6, the output terminal OUT of the second shift register unit 11-2 may be connected to one corresponding second scan line 74 driving one corresponding pixel row by pulling the line to the right, that is, one second shift register unit 11-2 may drives one corresponding pixel row, and the second shift register unit 11-2 may be driven in a one-to-one manner.

Figure 11:
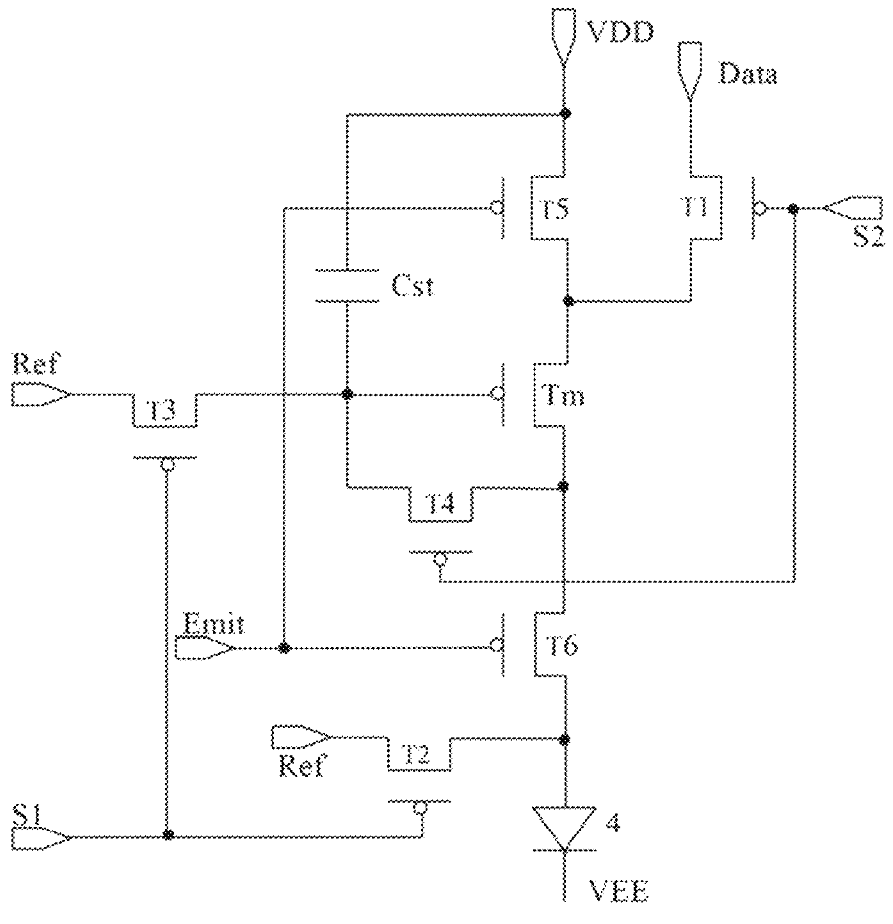
FIG. 11 illustrates an exemplary pixel circuit consistent with various disclosed embodiments in the present disclosure.

FIG. 11 may be a schematic diagram of a pixel circuit. As shown in FIG. 11, in one embodiment, the pixel circuit may include a driving transistor Tm, a data writing transistor T1, a gate reset transistor T3, a threshold compensation transistor T4, an electrode reset transistor T2, a first light-emitting control transistor T5, a second light-emitting control transistor T6 and a storage capacitor Cst. The operation process of the pixel circuit may at least include a reset phase, a write phase and a light-emitting phase. In the reset phase, the gate reset transistor T3 may be turned on under the control of the first scan signal S1 to write the reset signal Ref to the gate of the driving transistor Tm, and the electrode reset transistor T7 may be turned on under the control of the first scan signal S1 to write the reset signal Ref to the electrode of the light-emitting device 4. In the write phase, the data writing transistor T1 and the threshold compensation transistor T4 may be turned on under the control of the second scan signal S2, and the data voltage Data may be written to the gate of the driving transistor Tm and the threshold voltage of the driving transistor Tm may be self-checked and compensated. In the light-emitting phase, the first light-emitting control transistor T5 and the second light-emitting control transistor T6 may be turned on under the control of the light-emitting control signal Emit, and the driving transistor Tm may generate a driving current under the control of its gate voltage and provide the driving current to the light-emitting device 4. To drive the pixel circuit to work, a positive power supply voltage VDD and a negative power supply voltage VEE may be also required.

The pixel circuit in FIG. 11 is used as an example only to illustrate the present disclosure, and does not limit the scope of the present disclosure. In various embodiments, the pixel circuit may be any pixel circuit in existing technologies.

Figure 12:
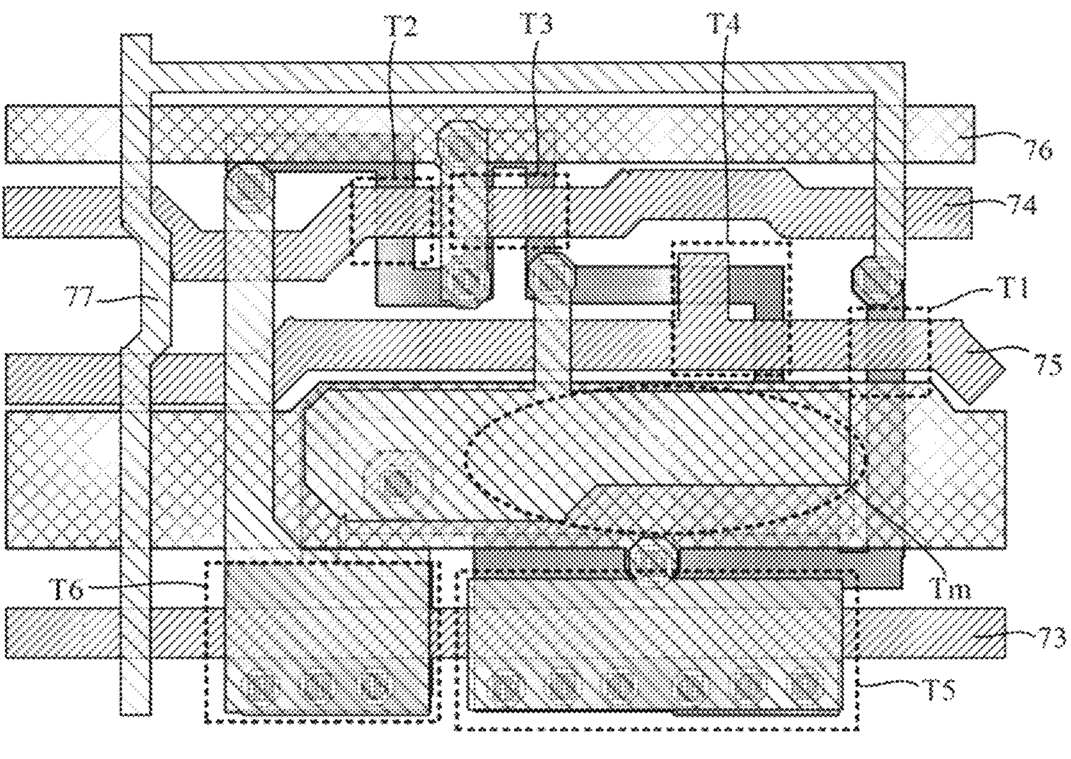
FIG. 12 illustrates a local view of another exemplary display panel consistent with various disclosed embodiments in the present disclosure.

FIG. 12 is a partial schematic diagram of another display panel and illustrates the location of the pixel circuits. The connection relationship between the transistors in FIG. 12 can be understood in conjunction with FIG. 11. FIG. 12 also illustrates a first scan line 73, a second scan line 74, a third scan line 75, a reset signal line 76, and a data line 77. The first scan line 73 may provide a light-emitting control signal Emit, the second scan line 74 may provide a first scan signal S1, the third scan line 75 may provide a second scan signal S2, the reset signal line 76 may provide a reset signal Ref, and the data line 77 may provide a data signal Data.

In conjunction with FIG. 6, the output terminal OUT of the first shift register unit 11-1 may be connected to two first scan lines 73. The output terminal OUT of the second shift register unit 11-2 may be connected to a second scan line 74 and a third scan line 75. The second scan line 74 and the third scan line 75 connected to the output terminal OUT of the second shift register unit 11-2 may drive different pixel rows. That is, the second scan line 74 and the third scan line 75 driving the same pixel row may be provided with signals by two adjacent second shift register units 11-2. In this embodiment, the first shift register 1-1 may provide a light-emitting control signal, and the second shift register 1-2 may provide a scanning control signal. Compared with the first shift register 1-1, the second shift register 1-2 may have a greater impact on the operation of the pixel circuit. Therefore, the first shift register 1-1 may be driven in a one-drive-two manner, and the second shift register 1-2 may be driven in a one-drive-one manner. That is, one first shift register unit 11-1 may drive two pixel rows, and one second shift register unit 11-2 may drive one pixel row.

FIG. 6 also illustrates a reset bus REF, and the reset signal line 76 may be connected to the reset bus REF. FIG. 6 also illustrates a constant voltage line BSM, and a bottom light shielding layer may be provided in the display panel. The bottom light shielding layer may be connected to the constant voltage line BSM, and may be located between the substrate and the active layer of one transistor. The bottom light shielding layer may be used to block light from the substrate side to the transistor channel to prevent the light from affecting the performance of the transistors.

In some embodiments, as shown in FIG. 2, FIG. 7 or FIG. 8, the shift register 1 may include a first shift register 1-1 and a second shift register 1-2. The first shift register 1-1 may include a plurality of cascaded first shift register units 11-1, and the second shift register 1-2 may include a plurality of cascaded second shift register units 11-2. Optionally, the first shift register 1-1 may provide a light-emitting control signal, and the second shift register 1-2 may provide a scanning control signal. The first shift register 1-1 may be set to be driven in a one-drive-two manner, and only one first shift register unit 11-1 may be required for two pixel rows. Therefore, a space may be reserved between two adjacent first shift register units 11-1 as a transmission area to ensure the transmittance of the setting position of the first shift register 1-1. Further, based on the one-drive-two driving mode, the length of the first shift register unit 11-1 in the first direction y may be set to be larger than its length in the second direction x, and the length of the first shift register unit 11-1 in the second direction x may be set to be smaller than the length of the second shift register unit 11-2 in the second direction x, and/or the length of the first shift register unit 11-1 in the first direction y may be larger than the length of the second shift register unit 11-2 in the first direction y. In this way, the length of the first shift register unit 11-1 in the first direction y may be appropriately increased to reduce the length occupied by the first shift register unit 11-1 in the second direction x, thereby reducing the number of pixel circuits 3 retracted in the second direction x, which may be conducive to reducing the number of connection lines.

In some embodiments, as shown in FIG. 6, the first shift register 1-1 may be located on the side of the second shift register 1-2 away from the pixel circuit 3. That is, the first shift register 1-1 may be closer to the edge of the display panel than the second shift register 1-2. When the first shift register 1-1 provides a light-emitting control signal and the second shift register 1-2 provides a scanning control signal, the second shift register 1-2 may be made closer to the pixel circuit 3, which is beneficial to reducing the delay of the output signal of the second shift register 1-2 and improves the display uniformity within the display panel.

Figure 13:
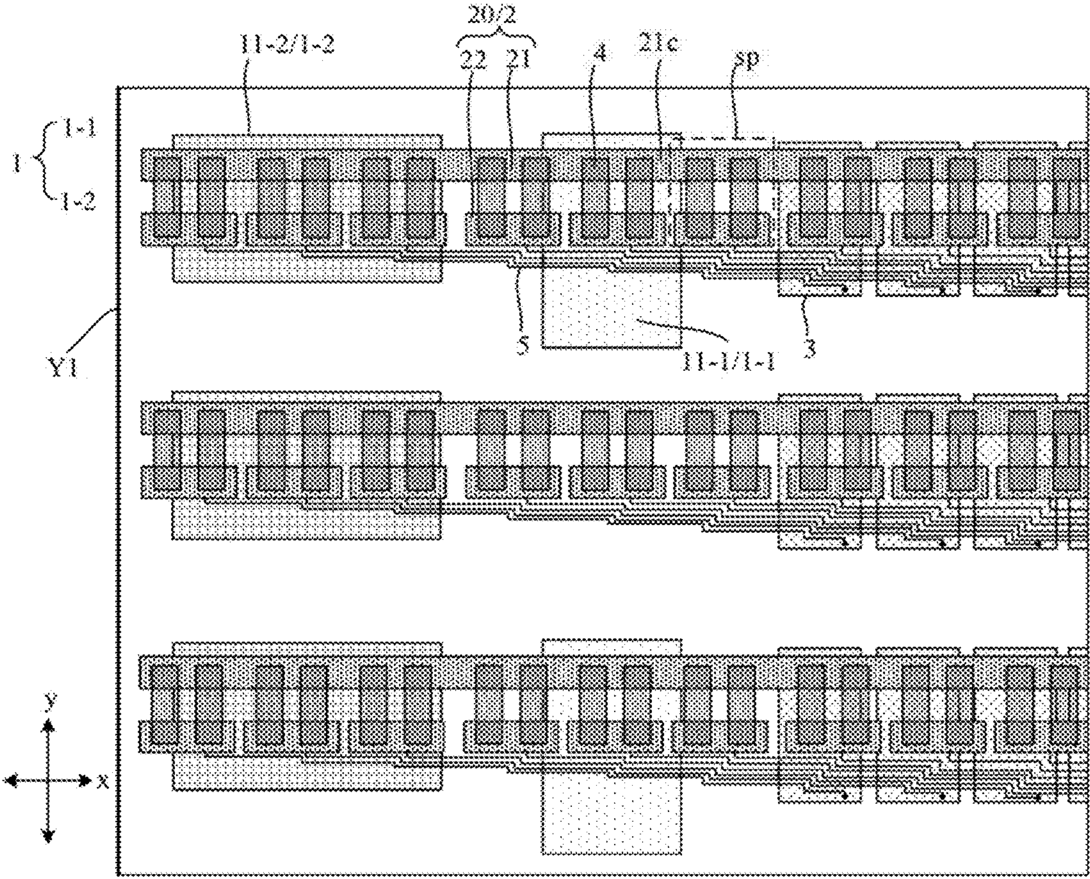
FIG. 13 illustrates a local view of another exemplary display panel consistent with various disclosed embodiments in the present disclosure.

In some other embodiments shown in FIG. 13 which is a partial schematic diagram of another display panel, the shift register 1 may include a first shift register 1-1 and a second shift register 1-2, and the first shift register 1-1 may be located on the side of the second shift register 1-2 close to the pixel circuit 3.

Figure 14:
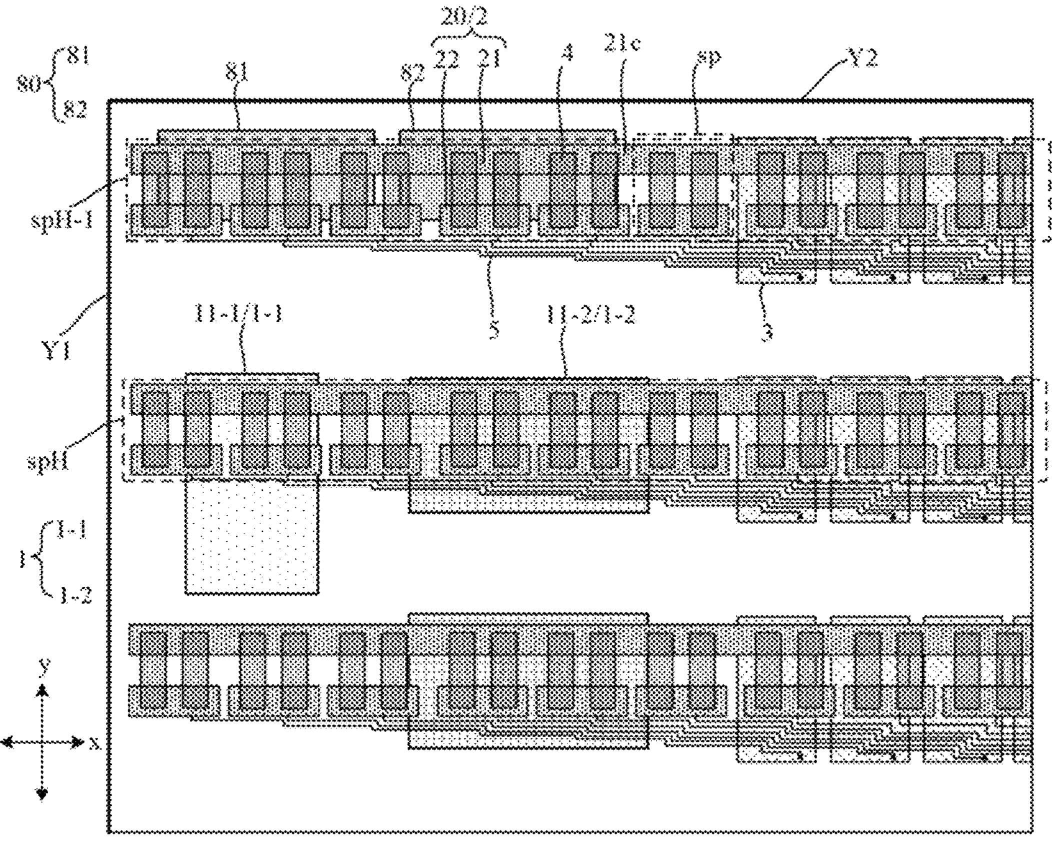
FIG. 14 illustrates a local view of another exemplary display panel consistent with various disclosed embodiments in the present disclosure.

FIG. 14 is a partial schematic diagram of another display panel. As shown in FIG. 14, in one embodiment, the display panel may further include an electrostatic discharge circuit 80. It can be seen from the top view of FIG. 14 that the electrostatic discharge circuit 80 overlaps with at least one electrode group 20 in a direction perpendicular to the plane where the substrate is located. One electrode group 20 may include a first electrode 21 and a second electrode 22, and the electrostatic discharge circuit 80 may overlap with the first electrode 21 and/or the second electrode 22 in the at least one electrode group 20. Since the electrode group 20 is used to bind the light-emitting devices 4, the electrostatic discharge circuit 80 may overlap with at least one light-emitting device 4. In existing technologies, the electrostatic discharge circuit is arranged in the frame area of the display panel. In the present embodiment, the electrostatic discharge circuit 80 may be arranged to overlap with at least one electrode group 20.

That is, at least part of the electrostatic discharge circuit 80 may be arranged in the display area, and the electrostatic discharge circuit 80 may overlap with at least one electrode group. In this way, the frame of the display panel may be further reduced, and the area of the transparent area may be not occupied in the transparent display, to achieve a high-transparency display effect in the edge area. As shown in FIG. 14, the length of the electrostatic discharge circuit 80 in the first direction y may be smaller than its length in the second direction x. The length of the electrostatic discharge circuit 80 in the first direction y may be relatively small. When the electrostatic discharge circuit 80 is arranged to overlap with at least one electrode group 20, the length of the electrostatic discharge circuit 80 and the at least one electrode group 20 that overlap each other in the first direction y may be relatively small. In this way, a relatively large area of a transparent area may be reserved between adjacent pixel rows spH to meet the requirements of transparent display. Further, the length of the electrostatic discharge circuit 80 in the second direction x may be set to be relatively large. The electrostatic discharge circuit 80 may be arranged to overlap with two or more electrode groups 20 arranged in the second direction x to meet the performance and structural requirements of the electrostatic discharge circuit 80.

Figure 15:
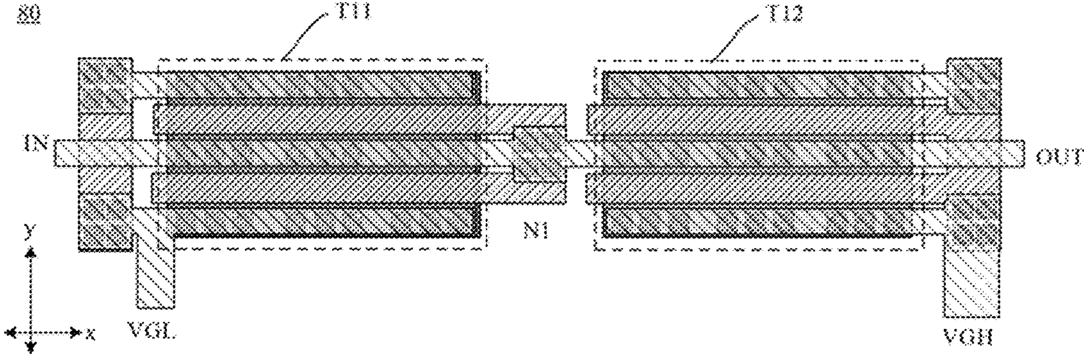
FIG. 15 illustrates another exemplary display panel consistent with various disclosed embodiments in the present disclosure.
Figure 16:
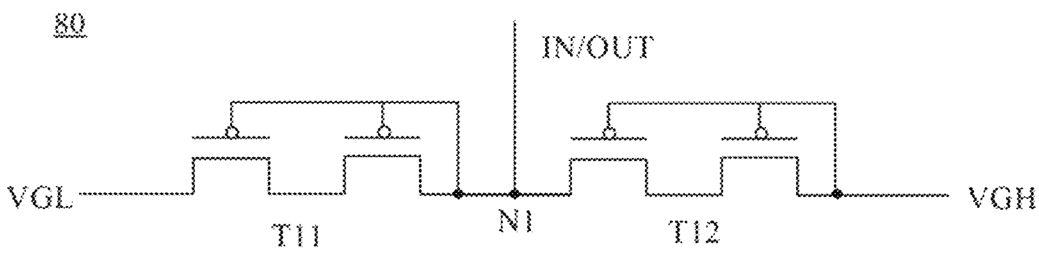
FIG. 16 illustrates an exemplary electrostatic discharge circuit in FIG. 15 consistent with various disclosed embodiments in the present disclosure.

In some embodiments shown in FIG. 15 which is another schematic diagram of a display panel illustrating the location of the electrostatic discharge circuit and FIG. 16 which is a circuit diagram of the electrostatic discharge circuit illustrated in FIG. 15, the electrostatic discharge circuit may include a first transistor T11 and a second transistor T12. A first electrode of the first transistor T11 may be connected to the second power supply signal VGL, and the gate and the second electrode of the first transistor T11 may be connected to the first node N1. The gate and the first electrode of the second transistor T12 may be connected to the first power supply signal VGH, and the second electrode of the second transistor T12 may be connected to the first node N1. The input terminal IN and the output terminal OUT of the electrostatic discharge circuit 80 may be respectively connected to the first node N1.

As shown in FIG. 15, the first transistor T11 and the second transistor T12 in the electrostatic discharge circuit 80 may be arranged in the second direction x. In combination with the description of the channel length direction and the channel width direction of the transistors in the first output module 61 in the embodiment shown in FIG. 3, it can be understood that the first transistor T11 and the second transistor T12 may respectively include a plurality of sub-transistors connected in parallel. As can be seen from FIG. 15, the channel width direction of the first transistor T11 and the second transistor T12 may be parallel to the second direction x, and the channel length direction of the first transistor T11 and the second transistor T12 may be parallel to the first direction y. In this way, the first transistor T11 and the second transistor T12 may have a relatively large width-to-length ratio under the condition that the length of the electrostatic discharge circuit 80 in the first direction y is less than its length in the second direction x, and the performance requirements of the electrostatic discharge circuit 80 may be met.

In one embodiment shown in FIG. 14, a plurality of first electrodes 21 arranged in the second direction x may be connected to each other to form a common electrode 21*c*. In a plurality of electrode groups 20 arranged along the second direction x, the second electrodes 22 may be located on one side of the common electrode 21*c* in the first direction y. Along the plane direction perpendicular to the substrate, the electrostatic discharge circuit 80 may overlap with the second electrode 22 and the common electrode 21*c*.

In some embodiments, the edge of the electrostatic discharge circuit 80 may be flush with the edge of the common electrode 21*c* away from the second electrode 22. Such a configuration may maximize the overlapping area of the electrostatic discharge circuit 80 and the electrode group 20 overlapping therewith, and the length occupied by the electrostatic discharge circuit 80 and the electrode group 20 overlapping therewith in the first direction y may be minimized. Therefore, a larger area of the transmission area may be reserved in the peripheral area of the electrostatic discharge circuit 80, thereby improving the transmittance of the transparent display.

In some embodiments, as shown in FIG. 14, the display panel may include sub-pixels sp, and one sub-pixel sp may include one electrode group 20. Multiple sub-pixels sp may be arranged in one pixel row spH in the second direction x. It can be seen from the top view of FIG. 14 that the electrostatic discharge circuit 80 overlaps with the electrode group 20 in the first pixel row spH-1 in a direction perpendicular to the plane where the substrate is located. The first pixel row spH-1 may be the pixel row closest to the edge of the display panel. As shown in FIG. 14, the display panel may include a first edge Y1 extending along the first direction y and a second edge Y2 extending along the second direction x, and the first pixel row spH-1 may be the pixel row closest to the second edge Y2.

As shown in FIG. 14, the plurality of cascaded shift register units in the shift register 1 may be arranged along the first direction y, and the plurality of shift register units in the shift register 1 may overlap with at least one electrode group 20. In the present disclosure, the shift register 1 and the electrostatic discharge circuit 80 may be arranged in the display area, and the electrostatic discharge circuit 80 may be arranged to overlap with the electrode group 20 in the first pixel row spH-1. Therefore, the cascade setting of the plurality of shift register units in the shift register 1 may be prevented from being affected, which may be more convenient to wire and to save wiring space.

In some embodiments, the electrostatic discharge circuit 80 may include a first electrostatic discharge circuit. As shown in FIG. 14, the first electrostatic discharge circuit 81 may overlap with at least one electrode group 20, and the first electrostatic discharge circuit 81 may overlap with the electrode group 20 in the first pixel row spH-1.

Optionally, in one embodiment, as shown in FIG. 14, along the first direction Y, the electrostatic discharge circuit 80 may overlap with at least one electrode group 20 in the first row. One electrode group 20 may include a first electrode 21 and a second electrode 22. The electrostatic discharge circuit 80 may overlap with the first electrode 21 and/or the second electrode 22 in at least one electrode group 20 in the first row. Since the electrode group 20 is used to bind the light-emitting devices 4, that is, the electrostatic discharge circuit 80 may overlap with at least one light-emitting device 4 in the first row.

Figure 17:
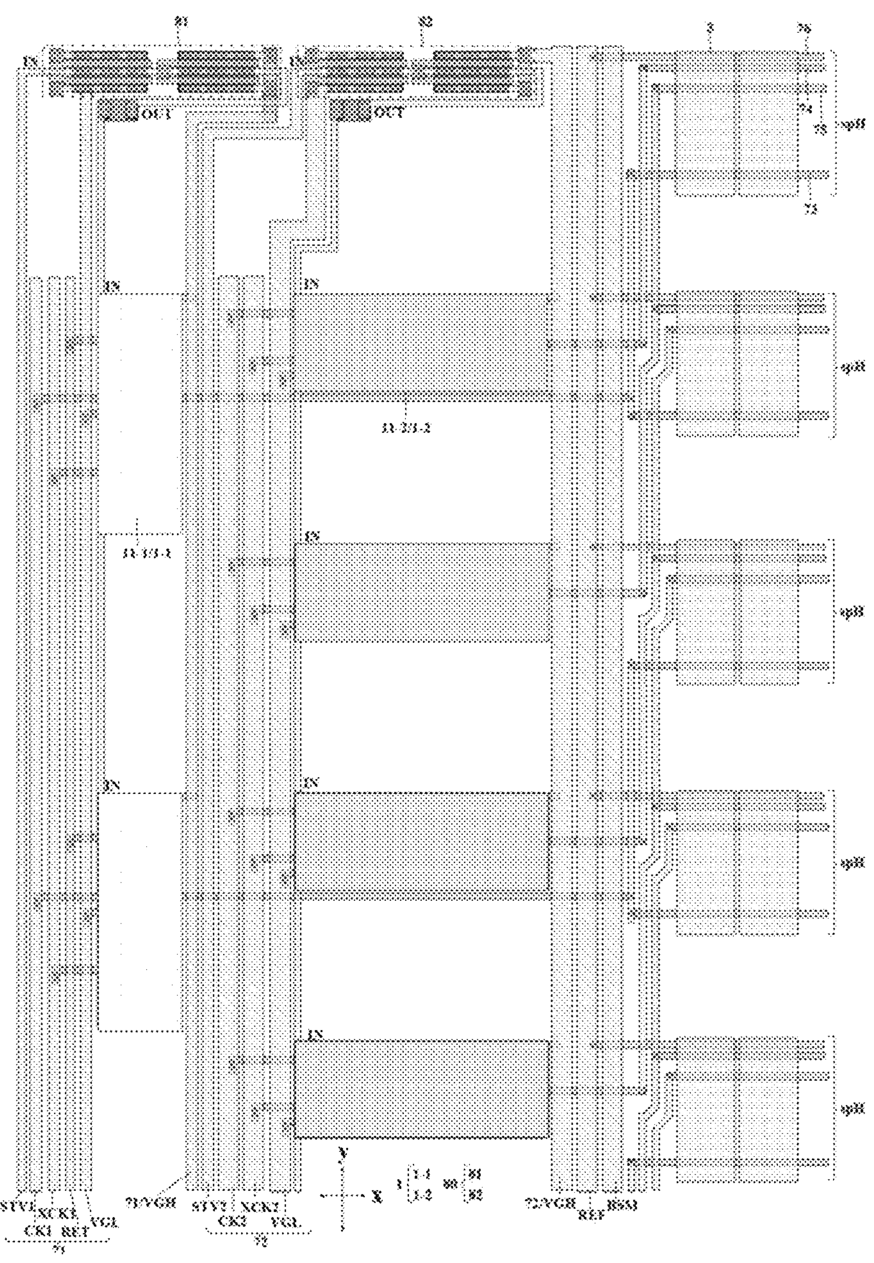
FIG. 17 illustrates another exemplary display panel consistent with various disclosed embodiments in the present disclosure.

FIG. 17 is another schematic diagram of a display panel, and illustrates the connection mode between the shift register 1 and the scan lines, the connection mode between the shift register 1 and the electrostatic discharge circuit 80, and the signal line driving the shift register 1. FIG. 17 does not show the electrode groups 20. The overlapping relationship between the shift register 1 and the electrode group 20, and the overlapping relationship between the electrostatic discharge circuit 80 and the electrode group 20, may be understood with reference to FIG. 14. As shown in FIG. 17, in one embodiment, the electrostatic discharge circuit 80 may include a first electrostatic discharge circuit 81, and the structure of the first electrostatic discharge circuit 81 may adopt the design of the embodiment shown in FIG. 15. The first shift register 1-1 may be connected to the first group of drive signal lines 71, and the first group of drive signal lines 71 may include a first start signal line STV1. The first electrostatic discharge circuit 81 may be connected to the first start signal line STV1. For example, the input terminal IN of the first electrostatic discharge circuit 81 may be connected to the first start signal line STV1, and the output terminal OUT of the first electrostatic discharge circuit 81 may be connected to the input terminal IN of the first shift register unit 11-1 of the first level. The first electrostatic discharge circuit 81 may be used to protect the first start signal line STV1 to prevent the accumulation of electrostatic charge from affecting the working performance of the first shift register 1-1.

As shown in FIG. 17, in some embodiments, the length of the first electrostatic discharge circuit 81 in the first direction y may be smaller than the length of the first shift register unit 11-1 in the first direction y, and/or the length of the first electrostatic discharge circuit 81 in the second direction x may be larger than the length of the first shift register unit 11-1 in the second direction x.

Combined with the design that the length of the first electrostatic discharge circuit 81 in the first direction y is less than its length in the second direction x and the length of the first shift register unit 11-1 in the first direction y is greater than its length in the second direction x, the length of the first electrostatic discharge circuit 81 in the first direction y may be set to be less than the length of the first shift register unit 11-1 in the first direction y. Therefore, the length occupied by the first electrostatic discharge circuit 81 and the electrode group 20 overlapping therewith in the first direction y may be less than the length occupied by the first shift register unit 11-1 and the electrode group 20 overlapping therewith in the first direction y, and a larger area of a transparent area may be reserved around the first electrostatic discharge circuit 81, which is conducive to improving the transmittance of the edge area of the transparent display. Since the first electrostatic discharge circuit 81 does not need to set multiple signal lines on the left and right sides like the first shift register unit 11-1, the length of the first electrostatic discharge circuit 81 in the second direction x may be set to be greater than the length of the first shift register unit 11-1 in the second direction x, which may not only reduce the length of the first electrostatic discharge circuit 81 in the first direction y but also does not increase the retracted distance of the pixel circuits.

As shown in FIG. 17, the first group of driving signal lines 71 may include a first power line VGH and a second power line VGL. In the second direction x, the first power line VGH and the second power line VGL may be respectively located on two sides of the first shift register 1-1. Such an arrangement may facilitate the connection between the first electrostatic discharge circuit 81 and the first power line VGH and the second power line VGL, reduce the winding of the power line, and may be conducive to increasing the transmittance of the peripheral area of the first electrostatic discharge circuit 81 and improving the display effect of transparent display.

As shown in FIG. 17, along the first direction y, the first electrostatic discharge circuit 81 may overlap with the first shift register unit 11-1. When the first electrostatic discharge circuit 81 is used to protect the first start signal line STV1 driving the first shift register 1-1, it may be convenient to connect the first start signal line STV1 with the first electrostatic discharge circuit 81, and it may be also convenient to connect the output terminal of the first electrostatic discharge circuit 81 with the first-level first shift register unit 11-1, which may reduce line winding and save wiring space.

In some embodiments, the first shift register 1-1 may include N first shift register units 11-1, and the n-th-level first shift register unit 11-1 may be respectively connected to the 2n-th pixel row spH and the (2n−1)-th pixel row spH through two first scan lines 73, where N and n are both positive integers, and n≤N/2. As shown in FIG. 14, the first electrostatic discharge circuit 81 may be set to overlap with the electrode group 20 in the first pixel row spH, and the first-level first shift register unit 11-1 may overlap with the electrode group 20 in the second pixel row spH. FIG. 17 shows the positions of five pixel rows spH, as well as some pixel circuits 3 in the pixel rows spH. The first scan lines 73 may be connected to the pixel circuits 3 in the pixel row spH, and two-level first shift register units 11-1 are also shown. As shown in FIG. 17, the first-level first shift register unit 11-1 may be connected to the second pixel row spH and the first pixel row spH through two first scan lines 73 respectively, and the second-level first shift register unit 11-1 may be connected to the fourth pixel row spH and the third pixel row spH through two first scan lines 73, respectively. That is, one first shift register unit 11-1 may be connected to two first scan lines 73, and the first shift register 1-1 may be driven in a one-to-one manner.

In some embodiments, along the direction perpendicular to the plane where the substrate is located, the n-th first shift register unit 11-1 may overlap with at least one electrode group 20 in the (2n)-th pixel row. As shown in FIG. 14 and FIG. 17, the first-level first shift register unit 11-1 may overlap with at least one electrode group 20 in the second pixel row spH, the second-level first shift register unit 11-1 may overlap with the electrode group 20 in the fourth pixel row spH, and the electrode group 20 in the third pixel row spH may not overlap with the first shift register unit 11-1. On the basis of setting the length of the first shift register unit 11-1 in the first direction y to be greater than its length in the second direction x to reduce the retracted distance of the pixel circuit 3, the design of the present embodiment may also reserve a larger area of a transparent area between two adjacent first shift register units 11-1 to achieve a transparent display effect with high transparency at the edge.

In some embodiments, a dummy first shift register unit may be further provided in the display panel, and the dummy first shift register unit may be connected to the last first shift register unit. The dummy first shift register unit may be set at the lower frame position of the display panel.

In some embodiments, the electrostatic discharge circuit 80 may also include a second electrostatic discharge circuit. The structure of the second electrostatic discharge circuit 82 shown in FIG. 14 and FIG. 17 may adopt the design of the embodiment shown in FIG. 15. As shown in FIG. 14, the second electrostatic discharge circuit 82 may overlap with at least one electrode group 20, and the second electrostatic discharge circuit 82 may overlap with the electrode group 20 in the first pixel row spH-1. As shown in FIG. 17, the second shift register 1-2 may be connected to the second group of drive signal lines 72. The second group of drive signal lines 72 may include a second start signal line STV2, and the second electrostatic discharge circuit 82 may be connected to the second start signal line STV2. The input terminal IN of the second electrostatic discharge circuit 82 may be connected to the second start signal line STV2, and the output terminal OUT of the second electrostatic discharge circuit 82 may be connected to the input terminal IN of the first-level second shift register unit 11-2. The second electrostatic discharge circuit 82 may be used to protect the second start signal line STV2 to prevent the accumulation of electrostatic charge from affecting the working performance of the second shift register 1-2.

As shown in FIG. 17, along the first direction y, the second electrostatic discharge circuit 82 may overlap with the second shift register unit 11-2. When the second electrostatic discharge circuit 82 is used to protect the second start signal line STV2 driving the second shift register unit 11-2, it may be convenient to connect the second start signal line STV2 with the second electrostatic discharge circuit 82, and it may be also convenient to connect the output terminal of the second electrostatic discharge circuit 82 with the input terminal of the first-level second shift register unit 11-2, reducing line winding and saving wiring space.

As shown in FIG. 14, the second electrostatic discharge circuit 82 may overlap with the electrode group 20 in the first pixel row spH-1. The pixel rows spH may be arranged along the first direction y, and the first-level second shift register unit 11-2 may overlap with the second pixel row spH. In the scheme of setting the second electrostatic discharge circuit 82, the second shift register 1-2 may be driven in the one-to-one manner, the second shift register unit 11-2 may be set to overlap with at least one electrode group 20, and the second-to-last second shift register unit 11-2 may overlap with the electrode group 20 in the last pixel row spH. The last-level second shift register unit 11-2 may be set at the lower frame position of the display panel.

In some embodiments, a dummy second shift register unit 11-2 may also be provided in the display panel, and the dummy second shift register unit 11-2 may be connected to the last-level second shift register unit 11-2. The dummy second shift register unit 11-2 may be set at the lower frame position of the display panel.

As shown in FIG. 17, the second shift register 1-2 may be connected to the second group of drive signal lines 72. The second group of drive signal lines 72 may include a third power line and a fourth power line. The third power line VGH and the first power line VGH in the first group of drive signal lines 71 may provide the same signal, and are represented by the same reference numeral. Similarly, the fourth power line VGL and the second power line VGL in the first group of drive signal lines 71 may provide the same signal. That is, one of the first group of drive signal lines 71 and the second group of drive signal lines 72 may include one first power line VGH and one second power line VGL. In the second direction x, the third power line VGH and the fourth power line VGL may be respectively located on two sides of the second shift register 1-2. Such a setting may facilitate the connection between the second electrostatic discharge circuit 82 and the third power line VGH and the fourth power line VGL, reduce the winding of the power line, and may be conducive to increasing the transmittance of the peripheral area of the second electrostatic discharge circuit 82 and improving the display effect of transparent display.

In some embodiments, the first shift register 1-1 may include N first shift register units 11-1, and the second shift register 1-2 may include 2*N second shift register units 11-2, where N is a positive integer. Along the second direction x, the m-th-level first shift register unit 11-1 may overlap with the (2m−1)-th level second shift register unit 11-2, where m is a positive integer and m≤N. FIG. 17 illustrates two first shift register units 11-1 and four second shift register units 11-2. As shown in FIG. 17, along the second direction x, the 1st level first shift register unit 11-1 may overlap with the 1st level second shift register unit 11-2, the 2-nd level first shift register unit 11-1 may overlap with the 3rd level second shift register unit 11-2, and the 2nd level second shift register unit 11-2 does not overlap with the first shift register units 11-1. In this embodiment, the first shift register 1-1 may be driven in the one-to-two manner, and the second shift register 1-2 may be driven in the one-to-one manner. The first shift register 1-1 may provide a light-emitting control signal, and the second shift register 1-2 may provide a scanning control signal.

Figure 18:
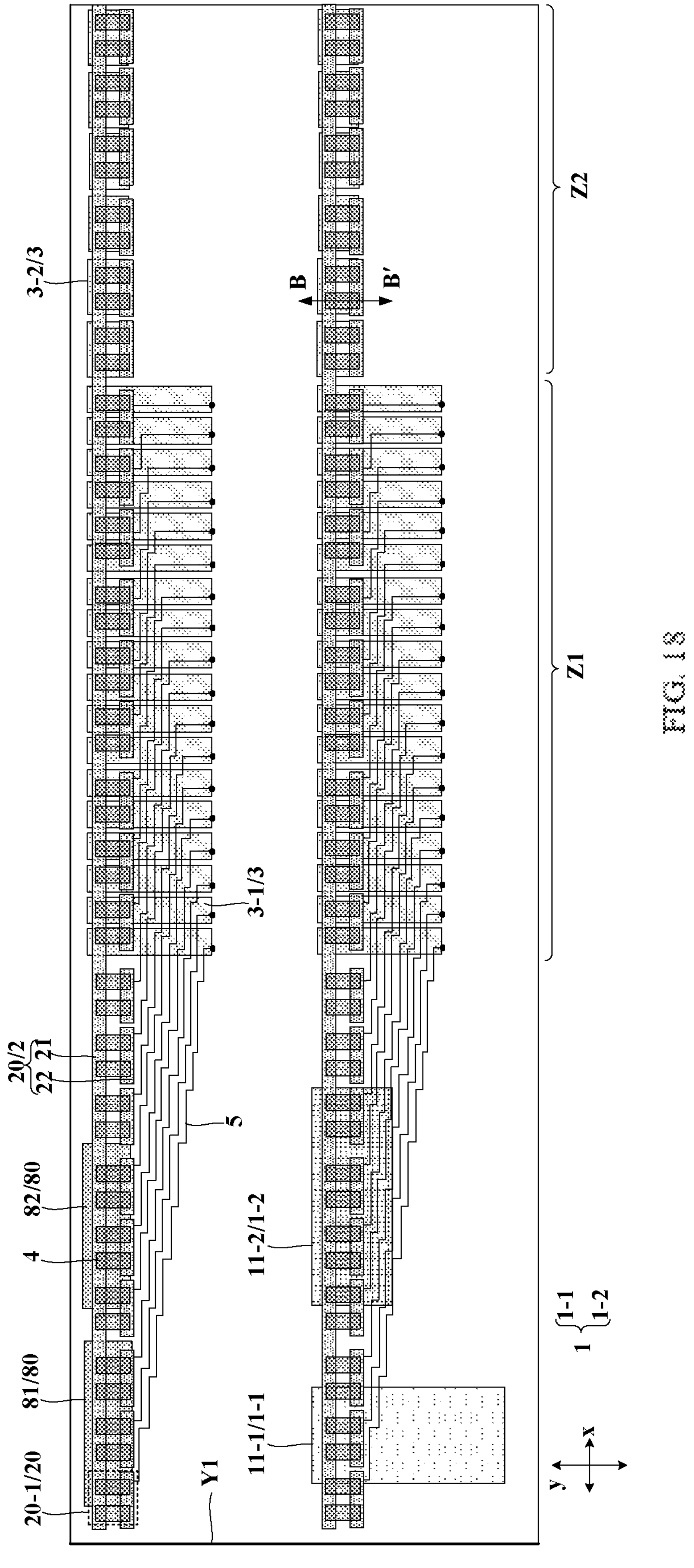
FIG. 18 illustrates another exemplary display panel consistent with various disclosed embodiments in the present disclosure.

In some embodiments shown in FIG. 18 which is a schematic diagram of another display panel, the display panel may include a plurality of pixel circuits 3, and the plurality of pixel circuits 3 may be connected to the electrode groups 20. For example, the plurality of pixel circuits 3 may be connected to the second electrodes 22 in the electrode groups 20. The electrode groups 20 may be used to bind the light-emitting devices 4. FIG. 18 shows that one electrode group 20 includes binding positions for two light-emitting devices 4. The plurality of pixel circuits 3 may include a first pixel circuit 3-1, and the electrode groups 20 may include a first electrode group 20-1. The first pixel circuit 3-1 may be connected to the first electrode group 20-1 through a connecting line 5, and the first electrode group 20-1 and the first pixel circuit 3-1 connected thereto may be staggered in the first direction y. As shown in FIG. 18, a first edge Y1 may extend along the first direction y, the first pixel circuit 3-1 may be one pixel circuit 3 set inward relative to the first edge Y1, and the first electrode group 20-1 and the first pixel circuit 3-1 connected thereto may be set staggered in the first direction y. A certain space may be reserved near the first edge Y1 in the display area where the light-emitting devices 4 are located, thereby enabling the shift register 1 to overlap with at least one electrode group 20. That is, at least part of the shift register 1 may be set in the display area to achieve a borderless display.

In some embodiments, the connecting line 5 and the first electrodes 21 and the second electrodes 22 are located in the same layer, and may be manufactured in the same process, which may simplify the process of the display panel and reduce the manufacturing cost.

As shown in FIG. 18, the connecting line 5 may include a line segment extending along the first direction y and a line segment extending along the second direction x. The two line segments whose extending directions intersect each other may be connected to form a step, and the connecting line 5 may be arranged in a step-shaped manner as a whole. Such a setting may reduce the area occupied by the multiple connecting lines 5 as a whole when multiple connecting lines 5 are arranged, thereby saving wiring space.

As shown in FIG. 18, the display panel may include a first area Z1 and a second area Z2, and the density of the pixel circuits 3 in the first area Z1 may be larger than the density of the pixel circuits 3 in the second area Z2. The first pixel circuit 3-1 may be located in the first area Z1, and the shift register 1 may be located on one side of the first pixel circuit 3-1 away from the second area Z2. The first pixel circuit 3-1 may be retracted relative to the edge of the display panel, and space for setting the shift register 1 may be reserved in the display area of the display panel. Setting the density of the pixel circuits 3 in the first area Z1 to be greater than the density of the pixel circuits 3 in the second area Z2 may reduce the number of the first pixel circuits 3-1 that are misaligned, thereby reducing the number of setting of the connecting lines 5, and further saving wiring space. Application in transparent display may improve the transmittance at the edge of the display panel.

As shown in FIG. 18, the pixel circuits 3 may also include a second pixel circuit 3-2, and the second pixel circuit 3-2 may be located in the second area Z2. The length of the first pixel circuit 3-1 in the first direction y may be larger than the length of the second pixel circuit 3-2 in the first direction y, and/or the length of the first pixel circuit 3-1 in the second direction x may be smaller than the length of the second pixel circuit 3-2 in the second direction x. The first direction y may be the column direction of the pixel circuits 3, and the second direction x may be the row direction of the pixel circuits 3. Compared with the second pixel circuit 3-2, the length of the first pixel circuit 3-1 in the first direction y may be relatively large and/or the length in the second direction x may be relatively small, which may reduce the number of the first pixel circuits 3-1 that are misaligned, thereby reducing the number of the connection lines 5 and saving wiring space. Application in transparent display may improve the transmittance at the edge of the display panel.

Figure 19:
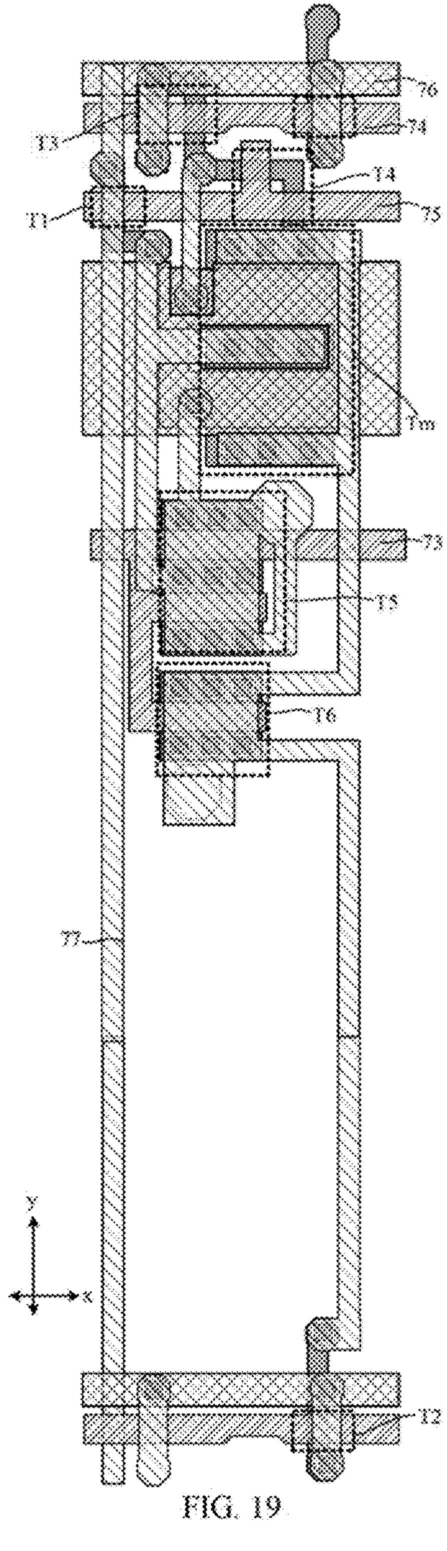
FIG. 19 illustrates a local view of another exemplary display panel consistent with various disclosed embodiments in the present disclosure.

In some embodiments shown in FIG. 19 which may be a partial schematic diagram of another display panel and illustrates the location of a pixel circuit, the connection relationship between the transistors in FIG. 19 may be understood in conjunction with FIG. 11. FIG. 19 also illustrates a first scan line 73, a second scan line 74, a third scan line 75, a reset signal line 76, and a data line 77. The first scan line 73 may provide a light-emitting control signal Emit, the second scan line 74 may provide a first scan signal S1, the third scan line 75 may provide a second scan signal S2, the reset signal line 76 may provide a reset signal Ref, and the data line 77 may provide a data signal Data.

FIG. 19 illustrates an optional structure of the first pixel circuit 3-1. The design of the embodiment of FIG. 19 may achieve that the length of the first pixel circuit 3-1 in the first direction y may be greater than its length in the second direction x. The second pixel circuit 3-2 may have the same structure as the pixel circuit provided in the embodiment of FIG. 12.

In some embodiments, one pixel circuit 3 may include a first functional transistor, and the width-to-length ratio of the first functional transistor in the first pixel circuit 3-1 may be equal to the width-to-length ratio of the first functional transistor in the second pixel circuit 3-2. The width-to-length ratio may be the ratio of the channel width to the channel length of the transistor. The first functional transistor may be a transistor with the same function in the first pixel circuit 3-1 and the second pixel circuit 3-2, such as the first functional transistor may be a driving transistor Tm. Setting the width-to-length ratio of transistors with the same function in the two pixel circuits to be the same may make the driving performance of the two pixel circuits the same, thereby improving the display uniformity within the display panel.

Figure 20:
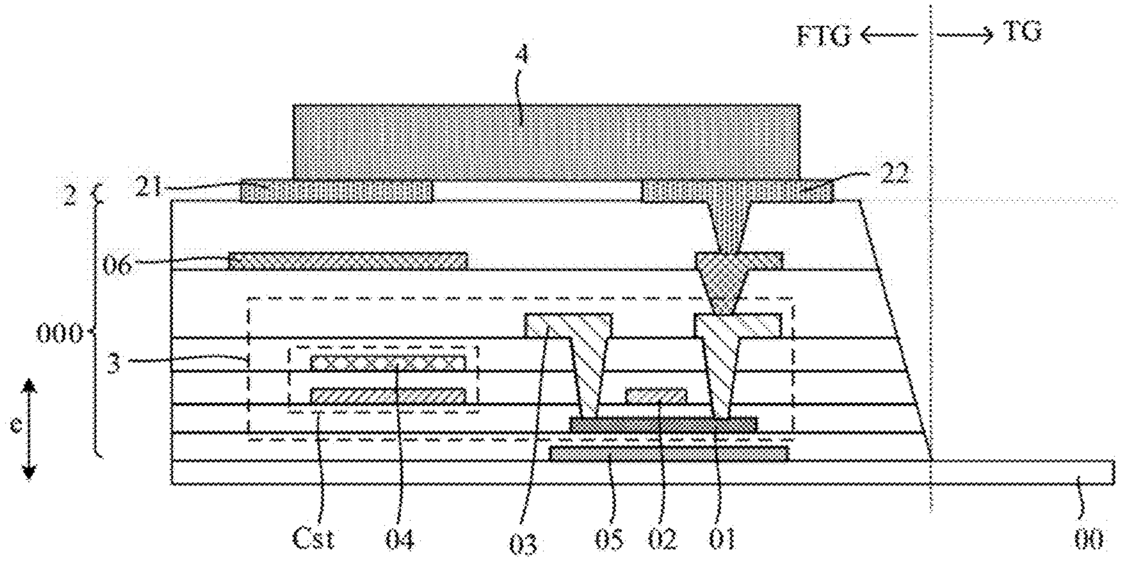
FIG. 20 illustrates a film layer structure of another exemplary display panel in FIG. 18 along a B-B' direction consistent with various disclosed embodiments in the present disclosure.

In some embodiments shown in FIG. 20 which is a schematic diagram of a film layer structure at the position of the tangent line B-B' in FIG. 18, the display panel may include a substrate 00, and a driving layer 000 located on the substrate 00. The driving layer 000 may include a semiconductor layer 01, a first metal layer 02, a second metal layer 03, a third metal layer 04, and a fourth metal layer 06. The active layers of the transistors and the wirings in some circuits may be located in the semiconductor layer 01. The gates of the transistors and some signal lines, such as the first scan line 73, the second scan line 74, and the third scan line 75, may be located in the first metal layer 02. The sources and drains of the transistors and some signal lines, such as the data line 77, may be located in the second metal layer 03. One plate of the storage capacitor Cst and the reset signal line 76 may be located in the third metal layer 04. A first constant voltage signal line may be also provided in the display panel, and the first constant voltage signal line may be used to provide a positive power supply voltage VDD required by the pixel circuits 3, and the first constant voltage signal line may be located in the fourth metal layer 06. A bottom light shielding layer 05 may be also provided between the semiconductor layer 01 and the substrate 00. In the direction e perpendicular to the plane where the substrate 00 is located, the bottom light shielding layer 05 may overlap with the active layers of the transistors. The bottom light shielding layer 05 may be connected to the constant voltage line BSM as shown in FIG. 6. The electrode layer 2 may be located on one side of the driving layer 000 away from the substrate 00, and the first electrodes 21 and a second electrode 22 may be located in the electrode layer 2. One terminal of one light emitting device 4 may be connected to one corresponding first electrode 21, and the other terminal may be connected to one corresponding second electrode 22. Further, an insulating layer may be provided between the semiconductor layer and the metal layer, and between the two metal layers, and the insulating layer is not shown in FIG. 20.

The display panel may include a transmission area TG and a non-transmission area FTG, and the pixel circuits 3 and the light-emitting devices 4 may be disposed in the non-transmission area FTG. Hollows may be formed on at least part of the insulating layer on the substrate 00, and the area where the hollows are located may be the transmission area TG. Because of the presence of the hollows in the insulating layer, there may be a step difference between the transmission area TG and the non-transmission area FTG, such that a groove is formed in the display panel. The location of the groove may be the transmission area TG. The boundary of the transmission area TG may be defined at the position where the step difference exists in the display panel. As shown in FIG. 20, the transmission area TG may be defined by the bottom edge of the groove on the display panel.

Figure 21:
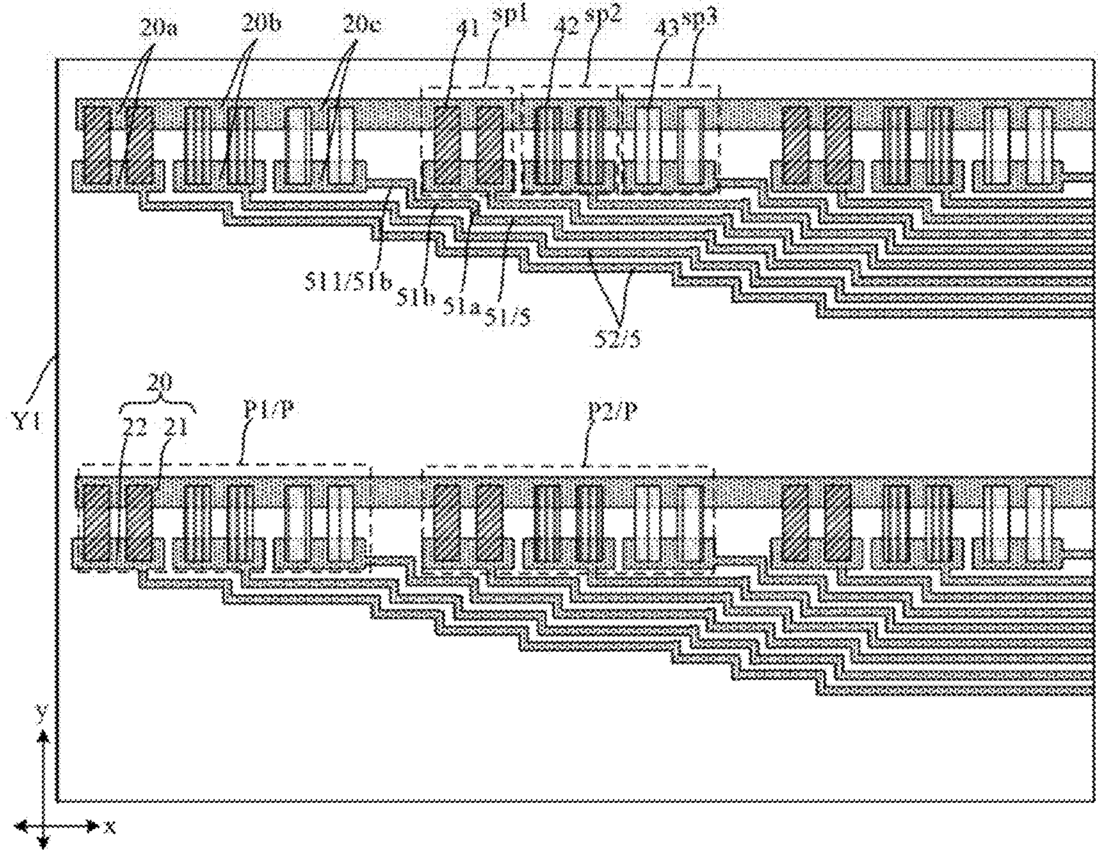
FIG. 21 illustrates a local view of another exemplary display panel consistent with various disclosed embodiments in the present disclosure.

In some embodiments shown in FIG. 21 which is a partial schematic diagram of another display panel, the display panel may include a first edge Y1 extending along the first direction y, and the connecting lines 5 may include a first connecting line 51. The display panel may include a plurality of pixel areas P, and one pixel area P may include three electrode groups 20 arranged in the second direction x. One electrode group 20 farthest from the first edge Y1 in the pixel area P may be connected to the first connecting line 51. The first connecting line 51 may include a first line segment 511 which is located between two adjacent pixel areas P, and is connected to the side of the second electrode 22 extending along the first direction y. Such a configuration may save the area occupied by the plurality of connecting lines 5 and the plurality of electrode groups 20 connected thereto in the first direction y, thereby reducing the area of the non-transmitting area, correspondingly increasing the area of the transmitting area, and improving the transmittance of the transparent display.

FIG. 21 illustrates a first light emitting device 41, a second light emitting device 42, and a third light emitting device 43 of different colors. The first sub-pixel sp1 may include the first light emitting device 41, the second sub-pixel sp2 may include the second light emitting device 42, and the third sub-pixel sp3 may include the third light emitting device 43.

The pixel area P may include the first sub-pixel sp1, the second sub-pixel sp2, and the third sub-pixel sp3 arranged in the second direction x. Optionally, the first light emitting device 41 may be a red LED, the second light emitting device 42 may be a green LED, and the third light emitting device 43 may be a blue LED. Therefore, the second electrode 22 corresponding to the blue LED may be connected to the first connecting line 51. FIG. 21 illustrates a partial display area on the left side of the display panel. It can be understood that when the pixel circuits are also set in the display area on the right side of the display panel, the second electrode 22 corresponding to the red LED in the pixel area P may be connected to the first connecting line 51.

As shown in FIG. 21, the first connecting line 51 may include at least one first sub-segment 51*a* and at least one second sub-segment 51*b*. The first sub-segment 51*a* may extend along the first direction y and the second sub-segment 51*b* may extend along the second direction x. The first sub-segment 51*a* and the second sub-segment 51*b* may be connected to form a step shape. The second sub-segment 51*b* may include a first segment 511. Such a configuration may make the arrangement of the multiple connecting lines 5 more compact, reduce the area occupied by the multiple connecting lines 5 as a whole, and thus save wiring space.

As shown in FIG. 21, the electrode group 20 may include a first sub-electrode group 20*a*, a second sub-electrode group 20*b* and a third sub-electrode group 20*c*. The first sub-pixel sp1 may include the first sub-electrode group 20*a*, the second sub-pixel sp2 may include the second sub-electrode group 20*b*, and the third sub-pixel sp3 may include the third sub-electrode group 20*c*. In the pixel area P, the first sub-electrode group 20*a* and the second sub-electrode group 20*b* may be located on one side of the third sub-electrode group 20*c* close to the first edge Y1. The third sub-electrode group 20*c* may be connected to the first connecting line 51. The connecting lines 5 may also include a second connecting line 52. The side of the second electrode 22 in the second sub-electrode group 20*b* extending along the second direction x may be connected to the second connecting line 52, and the side of the second electrode 22 in the first sub-electrode group 20*a* extending along the second direction x may be connected to the second connecting line 52. This embodiment reasonably designs the connection position between the electrode groups 20*a* and the connection lines 5 according to the position of the electrode groups 20*a* in the pixel area P, and reasonably utilizes the space around the pixel area P, such that the space occupied by the multiple connection lines 5 and the three electrode groups 20 in the pixel area P is small. Therefore, the area of the transmission area in the display panel may be increased, and the transparent display effect may be improved when applied in transparent display.

As shown in FIG. 21, the pixel areas P may include a first pixel area P1 and a second pixel area P2, and the first pixel area P1 and the second pixel area P2 may be adjacent to each other in the second direction x. The connection mode of the three electrode groups 20 and the connection lines 5 in the first pixel area P1 may be the same as the connection mode of the three electrode groups 20 and the connection lines 5 in the second pixel area P21. One pixel area P may include a first sub-electrode group 20*a*, a second sub-electrode group 20*b* and a third sub-electrode group 20*c* arranged in the second direction x. The first sub-electrode group 20*a* may be connected to the first light-emitting device 41, the second sub-electrode group 20*b* may be connected to the second light-emitting device 42, and the third sub-electrode group 20*c* may be connected to the third light-emitting device 43. In both the first pixel area P1 and the second pixel area P2, the first sub-electrode group 20*a* and the second sub-electrode group 20*b* may be respectively connected to the second connection line 52, and the third sub-electrode group 20*c* may be connected to the first connection line 51. Such a setting may make the arrangement of multiple connection lines 5 in the display panel more regular, which is more conducive to saving wiring space.

Figure 22:
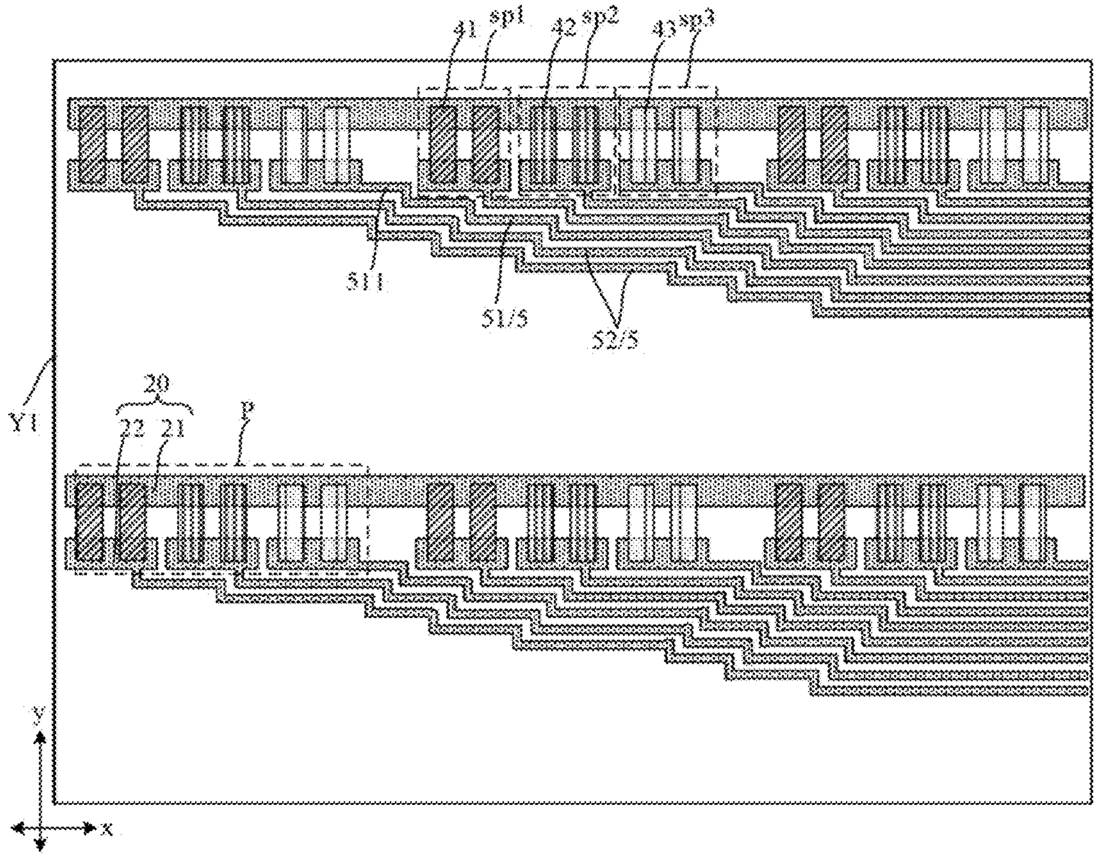
FIG. 22 illustrates a local view of another exemplary display panel consistent with various disclosed embodiments in the present disclosure.

In some embodiments shown in FIG. 22 which is a partial schematic diagram of another display panel provided, the first connecting line 51 may include a first line segment 511, and the first line segment 511 may be located between two adjacent pixel areas P. The first line segment 511 may be flush with the edge of the second electrode 22 extending along the second direction x. Such a setting may not only save the area occupied by the multiple connecting lines 5 and the multiple electrode groups 20 connected thereto as a whole in the first direction y, but also reduce the etching accuracy of the connecting line 5, reduce the difficulty of the etching process, and reduce the manufacturing cost of the display panel.

Figure 23:
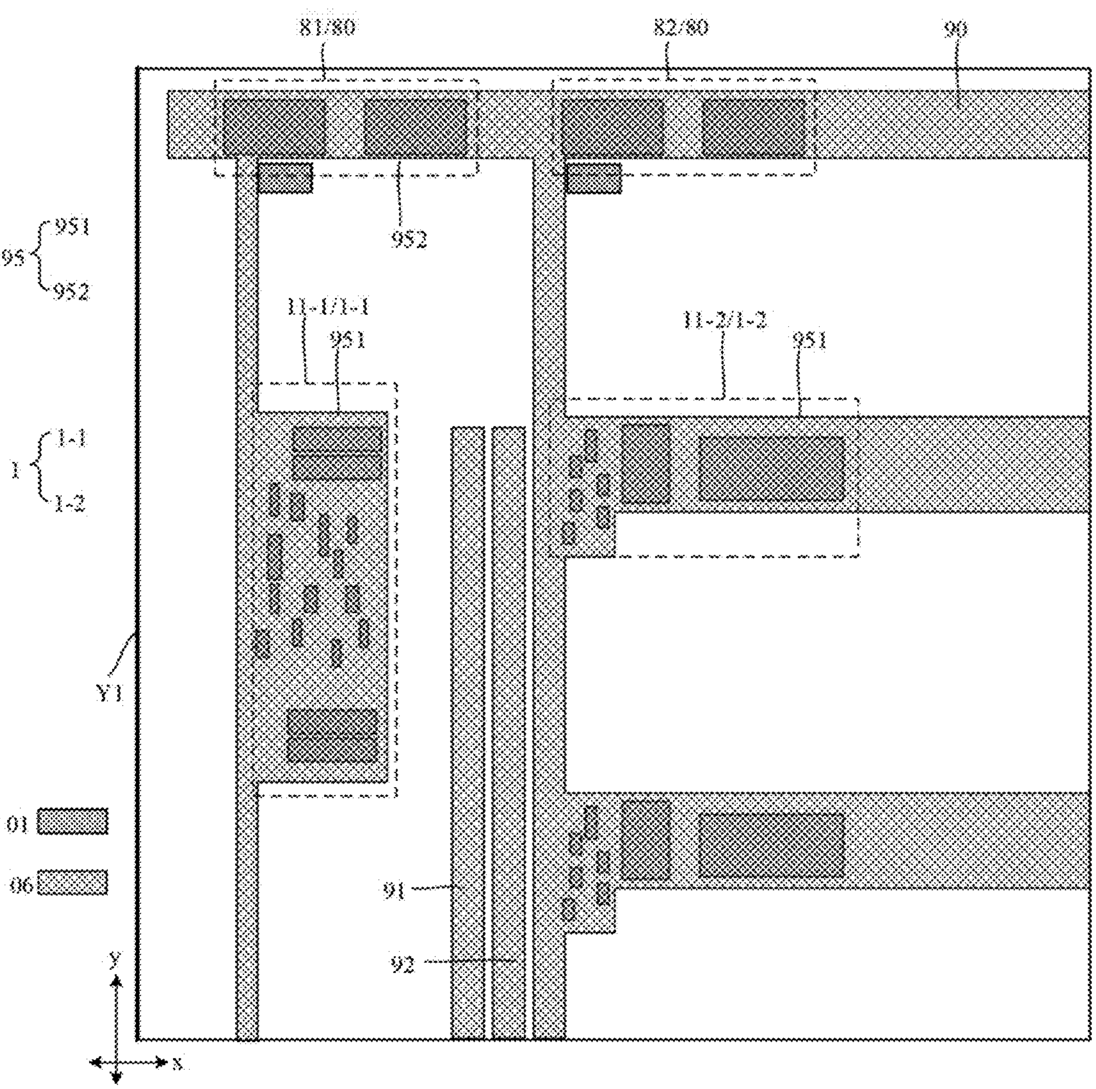
FIG. 23 illustrates another exemplary display panel consistent with various disclosed embodiments in the present disclosure.

In some embodiments shown in FIG. 23 which is another schematic diagram of a display panel and only illustrates only a partial structure of the semiconductor layer 01 and the fourth metal layer 06 near the first edge Y1 of the display panel where the positions of the shift register unit 1 and the electrostatic discharge circuit 80 are marked, the display panel may further includes a light shielding electrode 95, and the film layer where the light shielding electrode 95 is located may be disposed between the shift register unit 1 and the electrode layer 2 (as shown in FIG. 20). The light shielding electrode 95 may include a first light shielding electrode 951 and a second light shielding electrode 952. FIG. 23 is a top view of the display panel, and the positions of the shift register 1 and the electrostatic discharge circuit 80 are marked in FIG. 23. It can be seen from FIG. 23 that, in the direction perpendicular to the plane where the substrate is located, the first light shielding electrode 951 may overlap with the shift register unit 1, and the second light shielding electrode 952 may overlap with the electrostatic discharge circuit 80. The display panel may also include a first constant voltage signal line 90, and the pixel circuits 3 may be connected to the first constant voltage signal line 90. The first constant voltage signal line 90 may provide the positive power supply voltage VDD required by the pixel circuits 3. The light shielding electrode 95 may be connected to the first constant voltage signal line 90, and the light shielding electrode 95 and the first constant voltage signal line 90 may be located in the fourth metal layer 06. The position of the fourth metal layer 06 in the film layer structure of the display panel may be understood in conjunction with FIG. 20. In this embodiment, the light shielding electrode 95 may be provided, and the light shielding electrode 95 may be be used to block the light directed to the transistor channels on the side of the transistors away from the substrate 00, thereby reducing the transistor leakage caused by light and avoiding affecting the circuit performance. Further, the light shielding electrode 95 and the first constant voltage signal line 90 may be arranged in the same layer, which may simplify the process of the display panel and avoid large-area metal floating of the light shielding electrode 95.

The fourth metal layer 06 where the light shielding electrode 95 and the first constant voltage signal line 90 are located may be made of a material including at least one of metal aluminum, titanium, or molybdenum. For example, the fourth metal layer 06 may be a titanium/aluminum/titanium structure, or a molybdenum/aluminum/molybdenum structure.

FIG. 23 also schematically shows a first auxiliary line 91 and a second auxiliary line 92 located in the fourth metal layer 06. In combination with the embodiment of FIG. 6, the first auxiliary line 91 may be arranged to overlap and be electrically connected with the third clock signal CK2, and the second auxiliary line 92 may be arranged to overlap and be electrically connected with the fourth clock signal XCK2. The first auxiliary line 91 and the third clock signal CK2 may form a double-layer routing, and the second auxiliary line 92 and the fourth clock signal XCK2 may form a double-layer routing, such that the voltage drop on the second group of clock signal lines may be reduced and the delay of the output signal of the second shift register 1-2 may be reduced.

Figure 24:
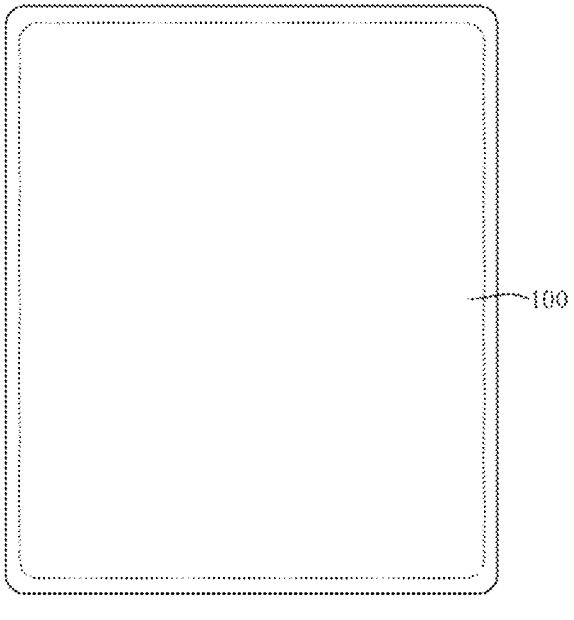
FIG. 24 illustrates an exemplary display device consistent with various disclosed embodiments in the present disclosure.

The present disclosure also provides a display device. In one embodiment shown in FIG. 24 which is a schematic diagram of a display device, the display device may include any display panel provided by various embodiments of the present disclosure. The display device may be an electronic device with a display function such as a cell phone, a tablet, a computer, a television, a smart wearable product, etc. The display device may be also a transparent display device, such as a transparent display window, a transparent splicing display device; or be a splicing display device, such as a large screen in a conference room, a large screen in an exhibition hall, etc.

In the present disclosure, relational terms such as "first" and "second" are only used to distinguish one entity or operation from another entity or operation, and do not necessarily require or imply that there is a relationship between these entities or operations. There is no such actual relationship or sequence. Furthermore, the terms "comprises", "include", or any other variations thereof are intended to cover a non-exclusive inclusion such that a process, method, article, or apparatus that includes a list of elements includes not only those elements, but also those not expressly listed, or elements inherent to the process, method, article or equipment. Without further limitation, an element defined by the statement "comprises a . . . " does not exclude the presence of additional identical elements in a process, method, article, or apparatus that includes the stated element.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising a substrate, a driving layer, and an electrode layer, wherein:

the driving layer and the electrode layer are located on a side of the substrate;

the driving layer includes a shift register, and the shift register includes a plurality of cascaded shift register units;

the electrode layer includes a plurality of electrode groups, and at least one of the plurality of electrode groups includes a first electrode and a second electrode;

along a direction perpendicular to a plane where the substrate is located, the plurality of shift register units at least partially overlaps with at least one of the plurality of electrode groups;

the driving layer further includes an electrostatic discharge circuit;

along the direction perpendicular to the plane where the substrate is located, the electrostatic discharge circuit overlaps with at least one of the electrode groups;

the plurality of shift register units are arranged along a first direction; and a length of the electrostatic discharge circuit in the first direction is smaller than a length of the electrostatic discharge circuit in a second direction, wherein the first direction intersects with the second direction.

2. The display panel according to claim 1, wherein:

the shift register includes a first shift register, and the first shift register includes a plurality of cascaded first shift register units;

the plurality of first shift register units are arranged along the first direction; and a length of the plurality of first shift register units in the first direction is larger than a length of the plurality of first shift register units in the second direction.

3. The display panel according to claim 2, wherein:

one first shift register unit of the plurality of first shift register units includes a first output module, wherein a channel width direction of a transistor in the first output module is parallel to the first direction and a channel length direction of a transistor in the first output module is parallel to the second direction; or one first shift register unit of the plurality of first shift register units includes a first switch module and a first output module, wherein the first output module includes a first output transistor and a second output transistor, wherein along the first direction, the first switch module is located between the first output transistor and the second output transistor.

4. The display panel according to claim 2, further including a plurality of sub-pixels on one side of the substrate, wherein:

the plurality of sub-pixels includes the plurality of electrode groups, and the plurality of the sub-pixels are arranged into pixel rows in the second direction;

the driving layer includes a plurality of first scanning lines, and one first scanning line connects multiple corresponding sub-pixels of the plurality of sub-pixels in one pixel row; and an output terminal of one of the plurality of first shift register units is connected to two of the plurality of first scanning lines.

5. The display panel according to claim 4, wherein:

the pixel rows are arranged along the first direction; and the first shift register includes N first shift register units, and the n-th-level first shift register unit is respectively connected to the second pixel row and the $(2n-1)$-th pixel row through two of the plurality of first scanning lines, wherein N and n are both positive integers and $n \leq N/2$.

6. The display panel according to claim 5, wherein:

along the direction perpendicular to the plane where the substrate is located, the n-th-level first shift register unit overlaps with at least one electrode group in the second pixel row.

7. The display panel according to claim 2, wherein:

the length of the plurality of first shift register units in the second direction is smaller than a length of three consecutively arranged electrode groups in the second direction; or the length of the plurality of first shift register units in the first direction is $L1$, and $LI<L2+L3$; wherein $L2$ is a length of the plurality of electrode groups in the first direction and $L3$ is a spacing distance between two adjacent electrode groups in the first direction.

8. The display panel according to claim 2, wherein:

the driving layer includes a first group of driving signal lines, and the first shift register is connected to the first group of driving signal lines;

the first group of driving signal lines includes a first power line and a second power line; and in the second direction, the first power line and the second power line are respectively located on two sides of the first shift register.

9. The display panel according to claim 8, wherein:

along the direction perpendicular to the plane where the substrate is located, at least one line in the first group of driving signal lines at least partially overlaps with the plurality of electrode groups.

10. The display panel according to claim 2, wherein:

a plurality of first electrodes arranged in the second direction are interconnected to form a common electrode;

in the plurality of electrode groups arranged along the second direction, second electrodes are located on one side of the common electrode in the first direction;

along the direction perpendicular to the plane where the substrate is located, the plurality of first shift register units overlaps with the second electrodes and the common electrode;

an edge of the plurality of first shift register units is flush with an edge of the common electrode on a side away from the second electrode; and along the first direction, a distance between two adjacent first shift register units is larger than a distance between two adjacent electrode groups.

11. The display panel according to claim 1, wherein:

the driving layer includes a plurality of pixel circuits, and the plurality of pixel circuits are connected to the plurality of electrode groups;

the plurality of pixel circuits include a first pixel circuit, and the plurality of electrode groups include a first electrode group;

the first electrode group and the first pixel circuit are staggered, and the first pixel circuit is connected to the first electrode group via a connecting line;

the display panel includes a first area and a second area;

a density of the pixel circuits in the first area is larger than a density of the pixel circuits in the second area; and the first pixel circuit is located in the first area, and the shift register is located on a side of the first pixel circuit away from the second area.

12. A display device comprising the display panel according to claim 1.

13. A display panel, comprising a substrate, a driving layer, and an electrode layer, wherein:

the driving layer and the electrode layer are located on a side of the substrate;

the driving layer includes a shift register, and the shift register includes a plurality of cascaded shift register units;

the electrode layer includes a plurality of electrode groups, and at least one of the plurality of electrode groups includes a first electrode and a second electrode;

along a direction perpendicular to a plane where the substrate is located, the plurality of shift register units at least partially overlaps with at least one of the plurality of electrode groups;

the shift register includes a first shift register, and the first shift register includes a plurality of cascaded first shift register units;

the plurality of first shift register units are arranged along a first direction;

a length of the plurality of first shift register units in the first direction is larger than a length of the plurality of first shift register units in a second direction, where the first direction intersects with the second direction;

the driving layer includes a first group of driving signal lines;

the first shift register is connected to the first group of driving signal lines;

the first group of driving signal lines includes a first start signal line;

the driving layer also includes a first electrostatic discharge circuit, and the first electrostatic discharge circuit is connected to the first start signal line; and a length of the first electrostatic discharge circuit in the first direction is smaller than the length of the plurality of first shift register units in the first direction, and/or the length of the first electrostatic discharge circuit in the second direction is larger than the length of the plurality of first shift register units in the second direction.

14. The display panel according to claim 13, wherein:

along the first direction, the first electrostatic discharge circuit overlaps with the plurality of first shift register units.

15. A display panel, comprising a substrate, a driving layer, and an electrode layer, wherein:

the driving layer and the at least one electrode layer are located on a side of the substrate;

the driving layer includes a shift register, and the shift register includes a plurality of cascaded shift register units;

the electrode layer includes a plurality of electrode groups, and at least one of the plurality of electrode groups includes a first electrode and a second electrode;

along a direction perpendicular to a plane where the substrate is located, the plurality of shift register units at least partially overlaps with at least one of the plurality of electrode groups;

the shift register includes a second shift register, wherein the second shift register includes a plurality of cascaded second shift register units arranged along a first direction;

a length of the plurality of second shift register units in the first direction is smaller than a length of the plurality of second shift register units in a second direction, wherein the first direction intersects the second direction;

the driving layer includes a second group of driving signal lines, and the second shift register is connected to the second group of driving signal lines;

the second group of driving signal lines includes a second start signal line;

the driving layer also includes a second electrostatic discharge circuit, and the second electrostatic discharge circuit is connected to the second start signal line; and along the first direction, the second electrostatic discharge circuit overlaps with the plurality of second shift register units.

16. The display panel according to claim 15, wherein:

at least one of the plurality of second shift register units includes a second output module, wherein a channel length direction of a transistor in the second output module is parallel to the first direction and a channel width direction of the transistor in the second output module is parallel to the second direction; or at least one of the plurality of second shift register units includes a second switch module and a second output module, wherein the second switch module and the second output module are arranged along the second direction.

17. The display panel according to claim 15, wherein:

the shift register includes a first shift register, and the first shift register includes a plurality of first shift register units connected in cascade; and a length of the plurality of first shift register units in the first direction is larger than a length of the plurality of first shift register units in the second direction.

18. The display panel according to claim 17, wherein:

the length of the plurality of first shift register units in the second direction is smaller than the length of the plurality of second shift register units in the second direction, and/or the length of the plurality of first shift register units in the first direction is larger than the length of the plurality of second shift register units in the first direction.

19. The display panel according to claim 17, wherein:

the driving layer includes a plurality of pixel circuits, and the plurality of pixel circuits are connected to the plurality of electrode groups; and the first shift register is located on a side of the second shift register away from the pixel circuits.

* * * * *